(12) United States Patent
Sakai et al.

(10) Patent No.: US 7,615,856 B2
(45) Date of Patent: Nov. 10, 2009

(54) INTEGRATED ANTENNA TYPE CIRCUIT APPARATUS

(75) Inventors: Atsushi Sakai, Gifu (JP); Ryosuke Usui, Ichinomiya (JP); Yasunori Inoue, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 136 days.

(21) Appl. No.: 11/215,131

(22) Filed: Aug. 31, 2005

(65) Prior Publication Data

US 2006/0049995 A1    Mar. 9, 2006

(30) Foreign Application Priority Data

Sep. 1, 2004    (JP) ............... 2004-254066
Sep. 27, 2004   (JP) ............... 2004-279398
Aug. 25, 2005   (JP) ............... 2005-243651

(51) Int. Cl.
*H01L 23/02* (2006.01)

(52) U.S. Cl. .............. 257/686; 257/E21.614; 257/685; 257/723; 257/777; 438/108; 438/109; 361/760

(58) Field of Classification Search .......... 257/E27.137, 257/E27.144, E27.161, 685, 686, 777, 723, 257/724, E21.614, E25.006, E25.013, E25.018, 257/E25.021, E25.027, E23.085; 437/108, 437/109; 361/760
See application file for complete search history.

(56) References Cited

U.S. PATENT DOCUMENTS

| | | | | |
|---|---|---|---|---|
| 6,038,133 | A * | 3/2000 | Nakatani et al. | 361/760 |
| 6,469,374 | B1 * | 10/2002 | Imoto | 257/686 |
| 6,713,860 | B2 * | 3/2004 | Li | 257/700 |
| 6,961,245 | B2 * | 11/2005 | Ikuta et al. | 361/719 |
| 6,991,966 | B2 * | 1/2006 | Tuominen | 438/118 |
| 7,006,359 | B2 * | 2/2006 | Galvagni et al. | 361/761 |
| 7,047,634 | B2 * | 5/2006 | Nakamura | 29/832 |
| 7,129,110 | B1 * | 10/2006 | Shibata | 438/106 |

(Continued)

FOREIGN PATENT DOCUMENTS

JP    02-065529    3/1990

(Continued)

OTHER PUBLICATIONS

Yamasaki, Hiroo, "EMC Digital Circuits." First Edition, Ohmsha Publishing, Nov. 2002, pp. 87-88.

(Continued)

*Primary Examiner*—Chris C Chu
(74) *Attorney, Agent, or Firm*—McDermott Will & Emery LLP

(57) ABSTRACT

An integrated antenna type circuit apparatus which provides excellent circuit characteristics while suppressing an increase in packaging area. The integrated antenna type circuit apparatus includes an insulating base, a semiconductor circuit device, chip parts, a molding resin, an antenna conductor, a ground conductor, and external lead electrodes. The plurality of chip parts are mounted on the insulating base, and are soldered to electrodes of wiring conductors on the top of the insulating base for electric and physical connection. The insulating base has a multilayer structure, being formed by laminating a plurality of insulator layers. The antenna conductor is formed on the bottom of the insulating base. A wiring conductor adjacent to the antenna conductor is provided with the ground conductor so that it overlaps with the antenna conductor.

6 Claims, 26 Drawing Sheets

U.S. PATENT DOCUMENTS 7,285,862 B2 * 10/2007 Sunohara et al. ............ 257/774
2004/0120128 A1 * 6/2004 Chang ........................ 361/764

FOREIGN PATENT DOCUMENTS

| JP | 04-056262 | 2/1992 |
| JP | 05-183328 | 7/1993 |
| JP | 5-251635 A | 9/1993 |
| JP | 06-077083 | 3/1994 |
| JP | 7-176946 A | 7/1995 |
| JP | 11-11055 A | 1/1999 |
| JP | 11-298097 | 10/1999 |
| JP | 2001-102517 | 4/2001 |
| JP | 2001-217381 | 8/2001 |
| JP | 2001-351085 | 12/2001 |
| JP | 2001-351448 | 12/2001 |
| JP | 2002-57268 A | 2/2002 |
| JP | 2002-198852 | 7/2002 |
| JP | 2003-032035 A | 1/2003 |
| WO | WO 99/13509 | 3/1999 |

OTHER PUBLICATIONS

Japanese Notification of Reason(s) for Refusal, w/ English translation thereof, issued in Patent Application No. JP 2004-279398 dated on Jul. 29, 2008.

Japanese Office Action, with English translation, issued in Japanese Patent Application No. JP 2004-279398, mailed Nov. 5, 2008.

Japanese Office Action, with English translation, issued in Japanese Patent Application No. JP 2005-243651, mailed Dec. 9, 2008.

Japanese Decision of Refusal, w/ English translation thereof, issued in Japanese Patent Application No. JP 2005-243651 dated Mar. 3, 2009.

* cited by examiner

FIG.23

| SUPPLY-GROUND PAIR NUMBER | EMI NOISE EMISSION LEVEL | NUMBER OF CAPACITIVE UNITS TO CONNECT |
|---|---|---|
| 1 | C | 2 |
| 2 | - | 0 |
| 3 | A | 10 |
| 4 | A | 10 |
| 5 | B | 6 |
| 6 | C | 2 |
| 7 | C | 2 |
| 8 | - | 0 |

INTEGRATED ANTENNA TYPE CIRCUIT APPARATUS

BACKGROUND OF THE INVENTION

1. Field of the Invention

The invention relates to a radio frequency semiconductor circuit apparatus with an integrated antenna.

2. Description of the Related Art

While compact information terminals such as a cellular phone and a personal digital assistance (PDA) are getting sophisticated at increasing speed, miniaturization and weight saving are indispensable for these products to be accepted in the market. On this account, not only functional and performance sophistication but also miniaturization is even required of the semiconductor circuits to be used in these compact information terminals.

For example, in mobile communication terminals for transmitting and receiving radio frequency signals in the form of electromagnetic waves, including cellular phones, Personal Handyphone Systems, and wireless cards, the miniaturization and integration of the semiconductor circuits to be used inside are significant challenges. These mobile communication terminals incorporate an antenna inside as well as a radio frequency circuit. If the antenna and the radio frequency circuit are arranged separately, the packaging area can be increased to preclude meeting the requirement for the miniaturization of the mobile communication terminals.

To reduce the packaging area, there have thus been proposed techniques for forming a radio frequency circuit and an antenna integrally on a single module.

For example, Japanese Patent Laid-Open Publication No. Hei 7-176946 (hereinafter, referred to as patent document 1) discloses the technology of forming and laminating an antenna and a radio frequency circuit in the same planar process.

Moreover, in Japanese Patent Laid-Open Publication No. Hei 11-11055 (hereinafter, referred to as patent document 2), an antenna conductor is formed on and integrated with a base on which electronic parts are arranged.

According to the technology described in patent document 1, the antenna and the radio frequency circuit are formed in an identical planar process. This has made it difficult, however, for these components to be merged with other semiconductor chips and chip parts. According to the technology described in patent document 2, the antenna consisting of a single wiring conductor layer must be formed on the base on which the electronic parts are arranged. Since the proximity of the antenna and the electronic parts causes limitations on the design pattern, there has been the problem that the antenna is hard to sophisticate in performance.

SUMMARY OF THE INVENTION

The present invention has been achieved in view of the foregoing problems. It is thus an object of the present invention to provide an integrated antenna type circuit apparatus which provides excellent circuit characteristics while suppressing an increase in packaging area.

To achieve the foregoing object, an integrated antenna type circuit apparatus according to one of the aspects of the present invention comprises: a signal processing circuit unit formed by laminating an insulator layer and a wiring conductor layer, and embedding a circuit device into the insulator layer; and an antenna conductor formed on the wiring conductor layer of the signal processing circuit unit. Here, the signal processing circuit unit has a ground is conductor formed on a wiring conductor layer lying between the antenna conductor and the circuit device, the ground conductor overlapping with the antenna conductor.

This integrated antenna type circuit apparatus has at least two insulator layers and at least two wiring conductor layers. The antenna conductor and the ground conductor are paired to function as an antenna for transmitting and receiving electromagnetic waves. This antenna includes one for conducting transmission of the electromagnetic waves alone, one for conducting reception alone, and one for conduction both transmission and reception. What is referred to as the "signal processing circuit unit" includes: a circuit for applying some processing to a signal input thereto and converting it into a signal having a frequency capable of emission from the antenna; one for converting the frequency of a signal received from the antenna and applying some processing to the frequency-converted signal; and one for performing both.

According to this aspect, the signal processing circuit unit having the circuit device embedded therein and the antenna are laminated with each other. It is therefore possible to integrate the antenna and the signal processing circuit unit without increasing the packaging area. Since the ground conductor is arranged between the antenna and the circuit device of the signal processing circuit unit, it is possible to improve the characteristics of the antenna and suppress malfunctions of the radio frequency circuit ascribable to the emitted electromagnetic waves. In addition, the ground conductor functions as a shield for blocking not only the electromagnetic waves emitted from the antenna but also foreign noise coming from the surroundings. This consequently allows an improvement of the circuit characteristics. Moreover, the ground conductor provides the effect of blocking unnecessary outgoing radiation from the radio frequency circuit, and thus is effective for electromagnetic interference (EMI) control.

The antenna conductor may be formed on a side of the radio frequency circuit opposite to one from which an external lead electrode is extended. An additional circuit device may be mounted on the side on which the antenna conductor is formed. Mounting the circuit device on a portion of the radio frequency circuit adjacent to the antenna conductor allows a further reduction in area.

The insulator layer between the antenna conductor and the wiring conductor layer on which the ground conductor is formed may be made of a material having a relative dielectric constant different from that of the other insulator layer. Since the antenna characteristics depend on the dielectric constant of the insulator layer between the antenna conductor and the ground conductor, an appropriate material can be selected to obtain desired antenna characteristics.

The insulator layer between the antenna conductor and the wiring conductor layer on which the ground conductor is formed may be made of an epoxy or phenol resin. When the material of the insulator layer between the antenna conductor and the ground conductor has a high dielectric constant, it is possible to reduce the area of the antenna conductor, and by extension to miniaturize the integrated antenna type circuit apparatus.

The insulator layer between the antenna conductor and the wiring conductor layer on which the ground conductor is formed may be made of a fluorocarbon resin or a liquid crystal polymer. The fluorocarbon resin refers to a fluorocarbon polymer which consists of fluorine atoms and carbon atoms. Among the known examples thereof is Teflon (registered trademark). When the material of the insulator layer between the antenna conductor and the ground conductor has a low dielectric constant, it is possible to improve the emission efficiency.

The circuit device may be a radio frequency identification (RFID) chip. The antenna conductor may receive a carrier transmitted from a reader-writer, and emit a carrier transmitted from the circuit device. This can suppress an increase in the packaging area since the RFID chip and the antenna conductor are laminated with each other. In addition, the ground conductor interposed between the RFID chip and the antenna conductor can improve the antenna characteristics and block foreign noise from the surroundings. Consequently, there is provided an integrated antenna type RFID which has excellent circuit characteristics.

BRIEF DESCRIPTION OF THE DRAWINGS

FIG. 23 is a chart showing examples of the numbers of capacitive units necessary for respective supply-ground pairs;

DETAILED DESCRIPTION OF THE INVENTION

First Embodiment

Figure 1:
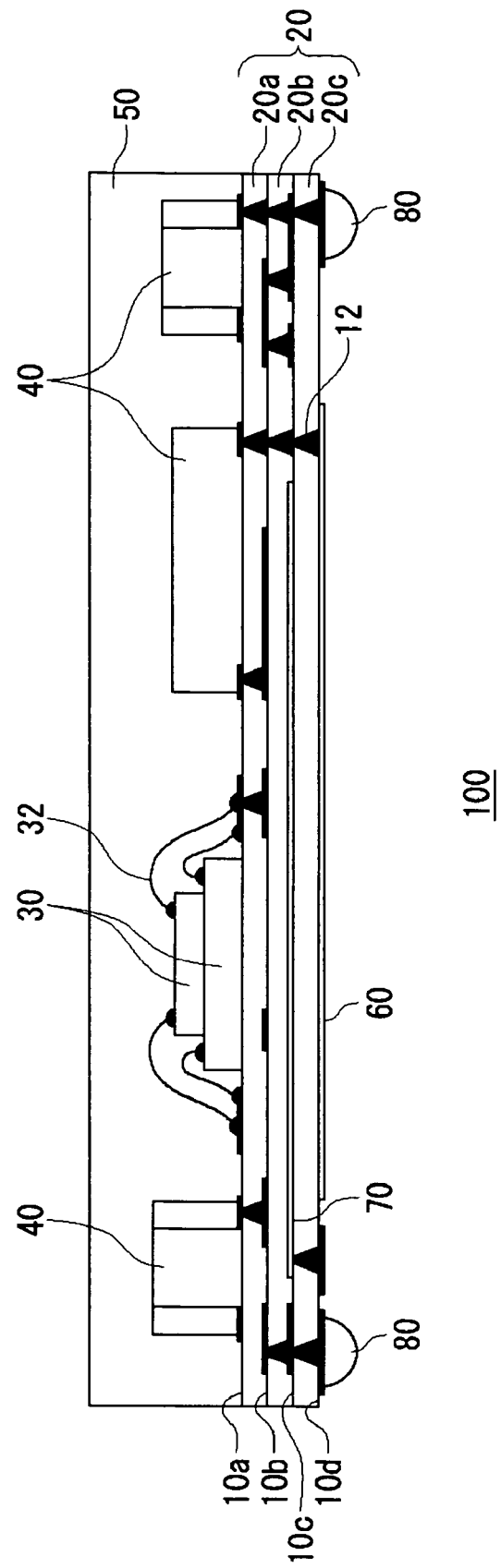
FIG. 1 is a sectional view showing the configuration of an integrated antenna type circuit apparatus according to a first embodiment.

FIG. 1 is a sectional view of an integrated antenna type circuit apparatus 100 according to a first embodiment. The integrated antenna type circuit apparatus 100 includes an insulating base 20, semiconductor circuit devices 30, chip parts 40, a molding resin 50, an antenna conductor 60, a ground conductor 70, and external lead electrodes 80. For the sake of convenience, in FIG. 1, the side on which the chip parts 40 are mounted shall be referred to as being upward, and the side on which the external lead electrodes 80 are formed being downward.

An example of the semiconductor circuit devices 30 is an IC chip in which transistors, diodes, and passive elements are integrated. The semiconductor circuit devices 30 are formed on a semiconductor substrate made of silicon, silicon germanium, gallium arsenide, or the like. By such means as a silver paste, the semiconductor circuit devices 30 are die bonded to the insulating base 20 for physical connection. Electrode pads of the semiconductor circuit devices 30 are electrically connected to the lead electrodes of a wiring conductor 10a on the top of the insulating base 20 by wire bonding, using gold wires 32.

The chip parts 40 specifically include capacitors, inductors, resistors, and so on. The plurality of chip parts 40 are mounted on the insulating base 20, and are soldered to the electrodes of the wiring conductor 10a on the top of the insulating base 20 for electric and physical connection.

The insulating base 20 has a multilayer structure, being formed by laminating a plurality of insulator layers 20a to 20c. These insulator layers 20a to 20c may be made of the same material or respective different materials.

The materials available for the insulator layers 20a to 20c include epoxy resins, melamine derivatives such as BT resin, liquid crystal polymers, PPE resins, polyimide resins, fluorocarbon resins, phenol resins, and polyamide bismaleimide.

Among the examples of the epoxy resins are melamine, melamine cyanurate, methylolated melamine, (iso)cyanurate, melam, melem, melon, succinoguanamine, melamine sulfate, acetoguanamine sulfate, melam sulfate, guanyl melamine sulfate, melamine resin, BT resin, cyanuric acid, isocyanuric acid, isocyanuric derivatives, melamine derivatives such as melamine isocyanurate, benzoguanamine, and acetoguanamine, and guanidine compounds.

Among the examples of the liquid crystal polymers are aromatic liquid crystal polyesters, polyimide, polyester amide, and resin compositions containing the same. Of these, liquid crystal polyesters or compositions containing the liquid crystal polyesters are preferable since they have heat resistance, workability, and moisture absorbability in excellent balance.

The examples of the liquid crystal polyesters include: (1) ones obtained from the reaction of aromatic dicarboxylic acid, aromatic diol, and aromatic hydroxycarboxylic acid; (2) ones obtained from the reaction of a combination of different types of aromatic hydroxycarboxylic acids; (3) ones obtained from the reaction of aromatic dicarboxylic acid and aromatic diol; and (4) ones obtained from the reaction of such polyesters as polyethylene terephthalate with aromatic hydroxycarboxylic acid. Incidentally, the foregoing aromatic dicarboxylic acid, aromatic diol, and aromatic hydroxycarboxylic acid may be replaced with their ester derivatives. Moreover, the foregoing aromatic dicarboxylic acid, aromatic diol, and aromatic hydroxycarboxylic acid may be replaced with ones in which the aromatic portions are substituted with halogen atom, an alkyl group, an aryl group, etc.

The insulator layers 20a to 20c are preferably made of aramid nonwoven fabric, which allows excellent workability. For the aramid fibers, para-aramid fibers or meta-aramid fibers are available. For example, poly(p-phenylene terephthalamide) (PPD-T) may be used as the para-aramid fibers, and poly(m-phenylene isophthalamide) (MPD-I) as the meta-aramid fibers.

Wiring conductors 10a to 10c are formed in respective predetermined patterns on the insulator layers 20a to 20c. The semiconductor circuit devices 30 and the plurality of chip parts 40 are thus connected with each other to form a radio frequency circuit. While the wiring conductors 10a to 10c form the wiring for connecting the individual parts, their wiring traces may also form inductors and capacitors so as to constitute filters and the like in combination.

The wiring patterns of the wiring conductors 10a to 10c formed in the respective different layers are electrically connected to each other by via plugs 12.

The semiconductor circuit devices 30 and the plurality of chip parts 40 formed on the surface of the insulating base 20 are sealed by the molding resin 50 which is molded by transfer molding, injection molding, or the like. Among the examples of the material for forming the molding resin 50 are thermosetting resins such as epoxy resins. The molding resin 50 may contain glass fillers and the like. This molding resin 50 is designed to a thickness at least greater than the heights of the semiconductor circuit devices 30 and the chip parts 40.

The external lead electrodes 80 are extended downward from the insulating base 20. For example, in the case of a ball grid array (BGA) package, the external lead electrodes 80 are formed as solder balls. The integrated antenna type circuit apparatus 100 is mounted on a printed-wiring board via the solder balls formed on the backside of the insulating base 20. With a land grid array (LGA) package, the external lead electrodes 80 are formed as metal electrodes.

The antenna conductor 60 is formed on the bottom of the insulating base 20. The wiring conductor 10c next to the antenna conductor 60 is provided with the ground conductor 70 so that it overlaps with the antenna conductor 60. The antenna conductor 60 and the ground conductor 70 function as a radio frequency antenna for transmitting and receiving electromagnetic waves.

The material of the insulator layer 20c interposed between the antenna conductor 60 and the ground conductor 70 is selected depending on the characteristics required of the antenna. For example, a material having a high dielectric constant, such as an epoxy resin and a phenol resin, can be used to shorten the wavelength inside the insulator layer, i.e., the dielectric. This makes it possible to reduce the area of the antenna conductor 60, thereby allowing the miniaturization of the integrated antenna type circuit apparatus 100.

In contrast, when the insulator layer is made of a material having a low dielectric constant, such as a fluorocarbon resin and a liquid crystal polymer, it is possible to improve the emission efficiency of the antenna. If the insulating base 20 is formed by laminating the insulator layers one by one, the layers can be made of respective different materials. This makes it possible to select materials optimized to the characteristics of the radio frequency circuit for the other insulator layers 20a and 20b, thereby achieving optimized characteristics of the entire integrated antenna type circuit apparatus 100.

A coating layer may also be formed to protect the antenna conductor 60. This coating layer is preferably made of a dielectric, or one having a low dielectric constant in particular. The same holds for second to fifth embodiments.

In the integrated antenna type circuit apparatus 100 configured as described above, the antenna conductor 60 and the ground conductor 70 are paired to function as an antenna for conducting either one or both of transmission and reception of electromagnetic waves. Electromagnetic waves radiated from the antenna conductor 60 are emitted to below the insulating base 20. This antenna conductor 60 also receives electromagnetic waves incoming from below the insulating base 20.

According to the present embodiment, the antenna conductor 60 and the external lead electrodes 80 are formed on the same side. When the integrated antenna type circuit apparatus 100 is mounted on a printed-wiring board or the like on a set, the antenna conductor 60 thus comes into contact with the printed-wiring board. Then, depending on the wavelength of the electromagnetic waves to be transmitted and received and the material of the printed-wiring board, an opening or the like may be formed in the printed-wiring board at the location of contact with the antenna conductor 60.

As above, the integrated antenna type circuit apparatus 100 can be reduced in area due to the integration of the antenna and the radio frequency circuit. Moreover, the ground conductor 70 is interposed between the antenna conductor 60 and the components of the radio frequency circuit, i.e., the semiconductor circuit devices 30 and the plurality of chip parts 40. It is therefore possible to inhibit the electromagnetic waves radiated from the antenna conductor 60 from affecting the radio frequency circuit.

Since the ground conductor 70 also functions as a shield for blocking foreign noise coming from the surroundings, the circuit characteristics can also be improved. This also provides the effect of blocking unnecessary outgoing radiation from the components of the radio frequency circuit, including the semiconductor circuit devices 30 and the plurality of chip parts 40, and thus is effective for electromagnetic interference (EMI) control.

Now, the method of manufacturing the integrated antenna type circuit apparatus 100 according to the present embodiment will be described with reference to FIG. 1. The integrated antenna type circuit apparatus 100 is formed upward from the bottom.

Initially, conductive films such as a copper foil are pasted onto both sides of the insulator layer 20c for the sake of patterning the wiring conductors 10c and 10d. The wiring patterns can be formed by using photoresist masks. For example, a chemical etchant is sprayed onto areas exposed from the resists so that the unnecessary portions of the conductive films are etched off. The etching resists may be made of etching resist materials available for ordinary printed-wiring boards. In this case, the wiring can be formed by silkscreen printing a resist ink. Alternatively, photosensitive dry films intended for an etching resist may be laminated on the conductive films, followed by photomasks for transmitting light to the configuration of the wiring conductors. After ultraviolet exposure, the unexposed portions are then removed by a developing solution.

When the wiring conductors are made of copper foils, the chemical etchant may be any of chemical etchants for use with ordinary printed-wiring boards. The examples include a solution of cupric chloride and hydrochloric acid, a ferric chloride solution, a solution of sulfuric acid and oxygenated water, and an ammonium persulfate solution. Photo solder resists and the like may be embedded into between the wiring traces if necessary.

The wiring conductor $10d$ is patterned into the antenna conductor 60. The wiring conductor $10c$ is patterned into the ground conductor 70 so that it overlaps with the antenna conductor 60. Incidentally, for the sake of maintaining a favorable ground potential, the ground conductor 70 is desirably connected to the external lead electrodes 80 through a number of via plugs 12 and connected to a ground plane outside.

The via plugs 12 can be formed by electroless plating or electrolytic plating, for example, in the following manner. Through holes are formed in an insulator layer by using carbon dioxide laser, YAG laser, dry etching, and the like in combination. Then, a thin film of 0.5 to 1 μm or so is formed all over the inner surfaces of the through holes by electroless copper plating. A film of approximately 20 μm is then formed by electrolytic plating. The electroless plating often uses palladium as a catalyst. To make the electroless plating catalyst adhere to the flexible insulating base, a palladium complex is mixed into an aqueous solution, and the flexible insulating base is immersed therein to make the palladium complex adhere to the surface. In that state, a reducing agent is applied to reduce the complex into metal palladium, whereby a core for starting the plating can be formed on the surface of the flexible insulating base.

The interiors of the via plugs 12 may be filled with filling material if necessary. A variety of filling materials are available, including insulating materials and conductive materials. The insulating materials include a photo solder resist and a transfer molding resin. The conductive materials include tin-containing solder. By plating or the like, copper may be embedded as the filling material.

These steps are also performed for the insulator layers $20b$ and $20a$ and the wiring conductors $10b$ and $10a$, whereby the insulating base 20 is formed. On this insulating base 20, the semiconductor circuit devices 30 and the plurality of chip pats 40 are mounted to form the circuit. Subsequently, the molding resin 50 is formed for sealing, so that the circuit elements, or the semiconductor circuit devices 30 and the plurality of chip parts 40, are embedded in the insulator layer. In addition, solder balls or the external lead electrodes 80 are formed on the bottom of the integrated antenna type circuit apparatus 100.

The integrated antenna type circuit apparatus 100 can thus be manufactured in the foregoing manner.

Second Embodiment

In the first embodiment, the components of the radio frequency circuit, i.e., the semiconductor circuit devices 30 and the plurality of chip parts 40 are formed on the insulating base 20 and sealed by the molding resin 50 so as to be embedded in the insulator layer.

In the integrated antenna type circuit apparatuses 100 according to second and subsequent embodiments to be described below, the semiconductor circuit devices 30 and the plurality of chip parts 40 are embedded in the insulating base 20. In the following embodiments, description of the same configuration as in the first embodiment will be omitted as appropriate.

Figure 2:
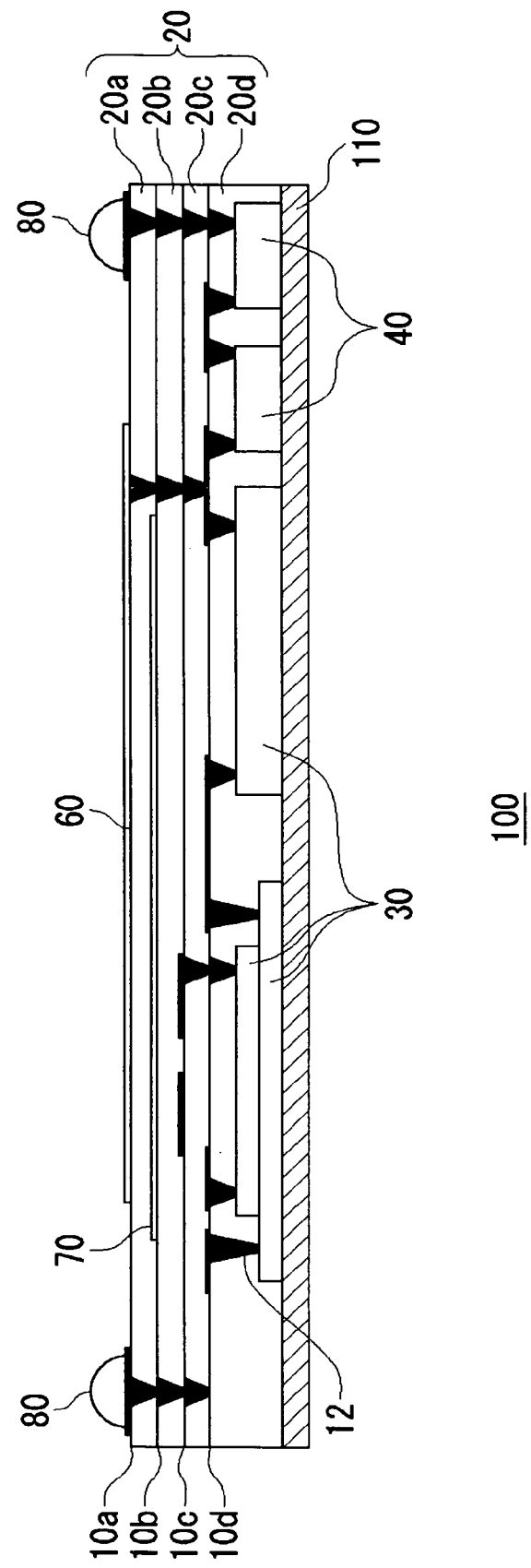
FIG. 2 is a sectional view showing the configuration of the integrated antenna type circuit apparatus according to a second embodiment.

FIG. 2 is a sectional view showing the configuration of the integrated antenna type circuit apparatus 100 according to the second embodiment. For ease of explanation, the side on which the chip components 40 are mounted shall be referred to as being upward, and the side on which the external lead electrodes 80 are formed being downward.

The integrated antenna type circuit apparatus 100 includes a base 110, an insulating base 20, semiconductor circuit devices 30, chip parts 40, an antenna conductor 60, a ground conductor 70, and external lead electrodes 80.

The examples of materials available for the base 110 include epoxy resins, melamine derivatives such as BT resin, liquid crystal polymers, PPE resins, polyimide resins, fluorine-based resins, phenol resins, and polyamide bismaleimide.

A plurality of semiconductor circuit devices 30 and chip parts 40 are die bonded to the base 110, and are embedded in an insulator layer $20d$.

The insulating base 20 has a multilayer structure, being formed by laminating a plurality of insulator layers $20a$ to $20d$. These insulator layers $20a$ to $20d$ may be made of the same material or respective different materials. The examples of the available materials include epoxy resins, melamine derivatives such as BT resin, liquid crystal polymers, PPE resins, polyimide resins, fluorine-based resins, phenol resins, and polyamide bismaleimide.

The insulator layers $20a$ to $20d$ are provided with via plugs 12, which establish connection between wiring conductors $10a$ to $10d$. The semiconductor circuit devices 30 and the plurality of chip parts 40 are also electrically connected to the wiring conductor $10d$ by the via plugs 12. The radio frequency circuit is thus formed inside the insulating base 20.

The antenna conductor 60 is arranged on the side opposite from the base 110 on which the semiconductor circuit devices 30 and the plurality of chip parts 40 are mounted. The wiring conductor $10b$ next to the antenna conductor 60 is provided with the ground conductor 70 so that it overlaps with the antenna conductor 60.

The integrated antenna type circuit apparatus 100 according to the present embodiment can also be reduced in area because of the integration of the antenna and the radio frequency circuit. Moreover, the ground conductor 70 is interposed between the antenna conductor 60 and the radio frequency circuit which is composed of the semiconductor circuit device 30 and the plurality of chip parts 40. It is therefore possible to inhibit the electromagnetic waves radiated from the antenna from affecting the radio frequency circuit. The ground conductor 70 can also block radio frequency noise coming from exterior, as well as reduce unnecessary outgoing radiation from the radio frequency circuit.

Now, the method of manufacturing the integrated antenna type circuit apparatus 100 according to the present embodiment will be described with reference to FIG. 2. The integrated antenna type circuit apparatus 100 is formed upward from the base 110 in order.

The semiconductor circuit devices 30 and the chip parts 40 are die bonded onto the base 110. This base 110 may have adhesiveness so that the elements can be fixed to the surface.

Next, the insulator layer $20d$ is formed. Here, an insulating resin film is pasted onto the base 110, followed by heating and vacuum pressing so that the semiconductor circuit devices 30 and the chip parts 40 are pressed in to form the insulator layer 20d.

The insulating resin film for forming the insulator layer 20d may contain fillers such as fibers. For example, particulates and fibers of $SiO_2$ or SiN may be used as the fillers. The insulating resin film is heated to bond the semiconductor circuit devices 30 and the chip parts 40 by thermocompression, and then cooled to room temperatures. Since the insulating resin film contains fillers or fibers, it is possible to reduce the warpage of the insulating resin film and improve the thermal conductivity as well.

Via plugs 12 are formed in the insulator layer 20d. Through these via plugs 12, the semiconductor circuit devices 30 and the chip parts 40 are connected to the wiring conductor 10d. The via plugs 12 can be formed as in the first embodiment. Subsequently, the upper insulator layers and wiring conductors are formed in succession as in the first embodiment, whereby the radio frequency circuit is formed.

Third Embodiment

Figure 3:
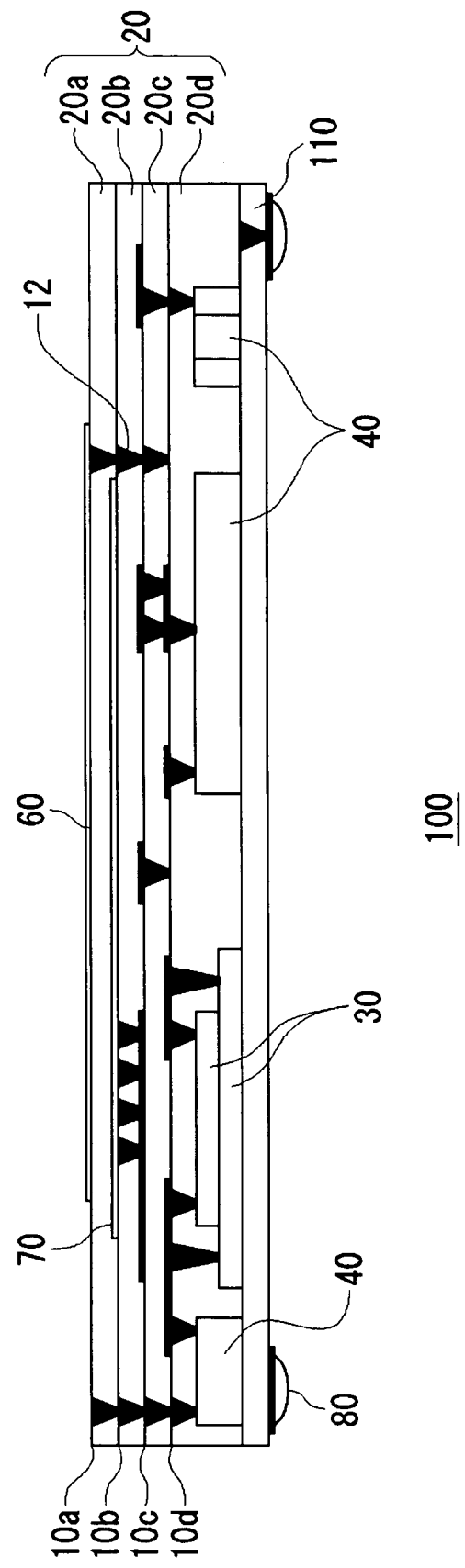
FIG. 3 is a sectional view showing the configuration of the integrated antenna type circuit apparatus according to a third embodiment.

FIG. 3 is a sectional view showing the configuration of the integrated antenna type circuit apparatus 100 according to a third embodiment. In the integrated antenna type circuit apparatus 100 shown in FIG. 2, the external lead electrodes 80 and the antenna conductor 60 are formed on the same side. In the present embodiment, the antenna conductor 60 is arranged on a side different from the external lead electrodes 80 are.

In other words, the present embodiment differs from the second embodiment in that the base 110 is also provided with via plugs 12 so as to establish connection between the external lead electrodes 80 and the wiring conductors. In other respects, the structure is the same as in the second embodiment.

In addition to the effects of the second embodiment described above, the present embodiment provides the following effects.

Since the antenna conductor 60 and the external lead electrodes 80 are formed on the opposite sides, the antenna falls on the side opposite from the printed-wiring board on which the integrated antenna type circuit apparatus 100 is mounted. Consequently, the electromagnetic waves transmitted and received through the antenna can be kept away from the printed-wiring board for the sake of high-quality communication. Besides, the-printed-wiring board need not have any opening.

It may sometimes be impossible to conduct transmission and reception via the printed-wiring board, depending on the frequency of the electromagnetic waves to be transmitted and received through the antenna and the material of the printed-wiring board in particular. In other cases, it may be difficult to make a hole in the printed-wiring board. Since the antenna conductor 60 is formed on the side different from the external lead electrodes 80 are, it is possible to increase the degree of flexibility in mounting the integrated antenna type circuit apparatus 100, and carry out signal transmission and reception more favorably.

Figure 4:
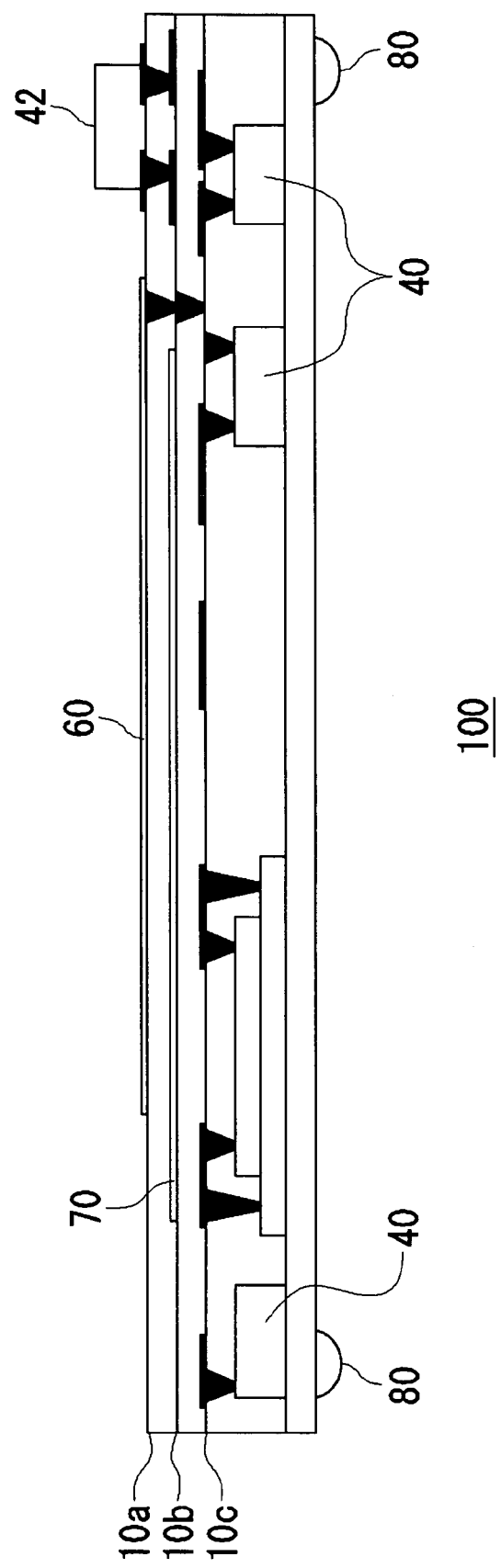
FIG. 4 is a sectional view showing the configuration of a modification of the integrated antenna type circuit apparatus according to the third embodiment.

FIG. 4 shows a modification of the present embodiment. A circuit part 42 is mounted on the top of the integrated antenna type circuit apparatus 100, next to the antenna conductor 60. Examples of this circuit part 42 include: (1) parts that are hard to embed into the insulating base 20; and (2) parts intended to make a final adjustment to the circuit constants such as resistors and capacitors.

Figure 5:
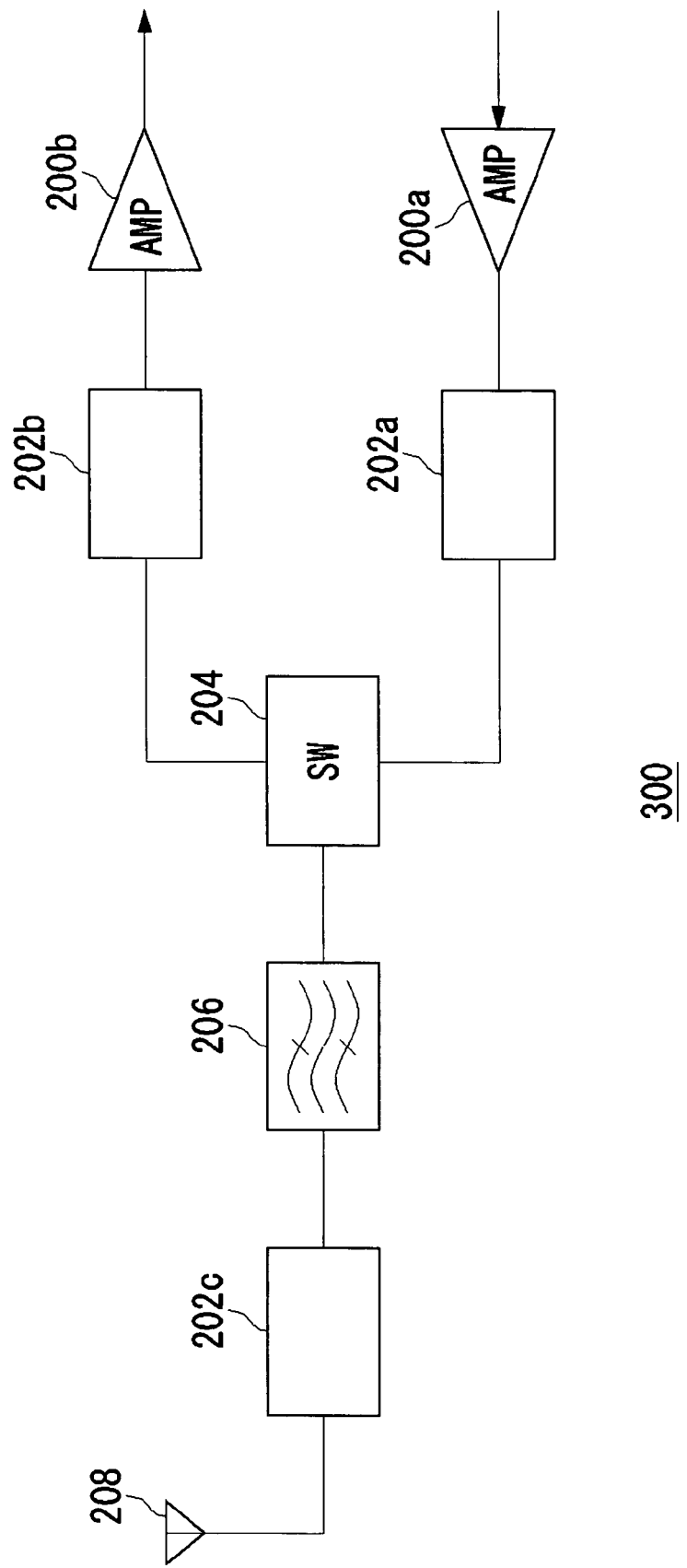
FIG. 5 is a block diagram showing the transmitting and receiving system of a cellular phone terminal.

The integrated antenna type circuit apparatus 100 like this may be applied to, for example, a radio frequency module 300 shown in FIG. 5, in which the transmission and reception blocks of a cellular phone terminal are integrated. The radio frequency module 300 includes a transmission amplifier 200a, a reception amplifier 200b, matching circuits 202a to 202c, an antenna switch 204, a filter 206, and an antenna 208. The antenna 208 can be composed of the antenna conductor 60 and the ground conductor 70 on the top of the radio frequency module as shown in FIG. 4. The transmission amplifier 200a, the reception amplifier 200b, and the antenna switch 204 may be embedded in the insulator layers.

If these components are greater in size than the other parts such as the filter 206, and thus are hard to embed into the insulator layers, they may be mounted on the surface as the circuit part 42 shown in FIG. 4. When a duplexer is used instead of the antenna switch 204, the duplexer may be mounted on the surface.

The matching circuits 202a to 202c are composed of capacitors and inductors. When these capacitors and the like are made of chip parts, these parts can be formed as the circuit part 42 on the surface of the integrated antenna type circuit apparatus 100. This makes it possible to make a final adjustment for impedance matching.

According to this modification, it is possible to achieve more effective integration aside from the foregoing effects. Moreover, after the assembly of the radio frequency module, circuit constants can be adjusted in a test phase and the like for improved circuit characteristics. This also allows an improvement in yield.

Fourth Embodiment

Figure 6:
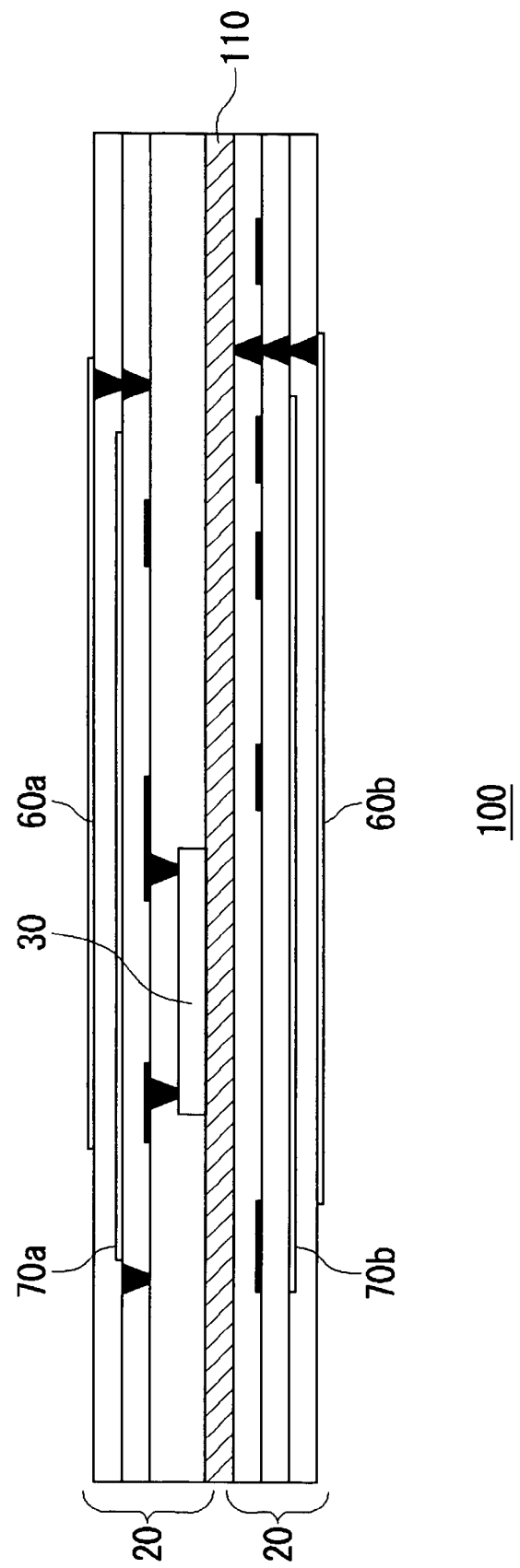
FIG. 6 is a sectional view showing the configuration of the integrated antenna type circuit apparatus according to a fourth embodiment.

FIG. 6 is a sectional view showing the configuration of the integrated antenna type circuit apparatus 100 according to a fourth embodiment. The antenna-integrated type circuit apparatus 100 shown in FIG. 6 has antenna conductors 60a and 60b on both sides thereof. In other respects, the configuration is the same as in the second and third embodiments.

When the antennas are formed on both sides of the integrated antenna type circuit apparatus 100, it is possible, for example, to use the antenna conductor 60a formed on one side as a transmitting antenna and use the antenna conductor 60b formed on the other side as a receiving antenna. The shapes of the antenna conductors 60a and 60b can be optimized for transmission and reception, respectively. The materials of the insulator layers interposed between the antenna conductors 60a and 60b and the adjacent ground conductors 70a and 70b can also be optimized for the transmitting antenna and the receiving antenna, respectively.

Moreover, the two antennas may be used as a diversity antenna. This makes it possible to transmit and receive electromagnetic waves with higher stability.

Fifth Embodiment

Figure 7:
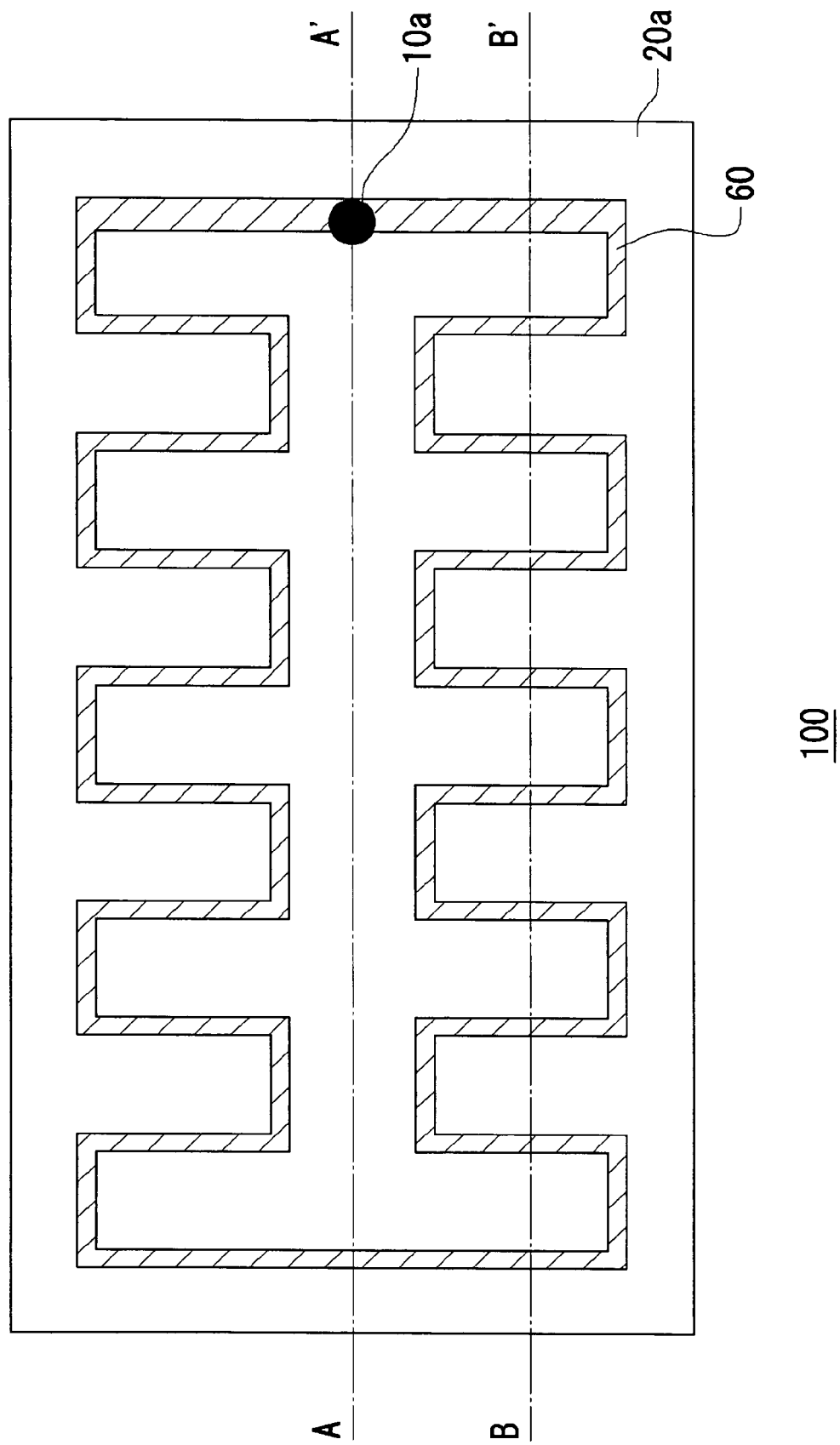
FIG. 7 is a plan view showing the configuration of the integrated antenna type circuit apparatus according to a fifth embodiment.
Figure 8:
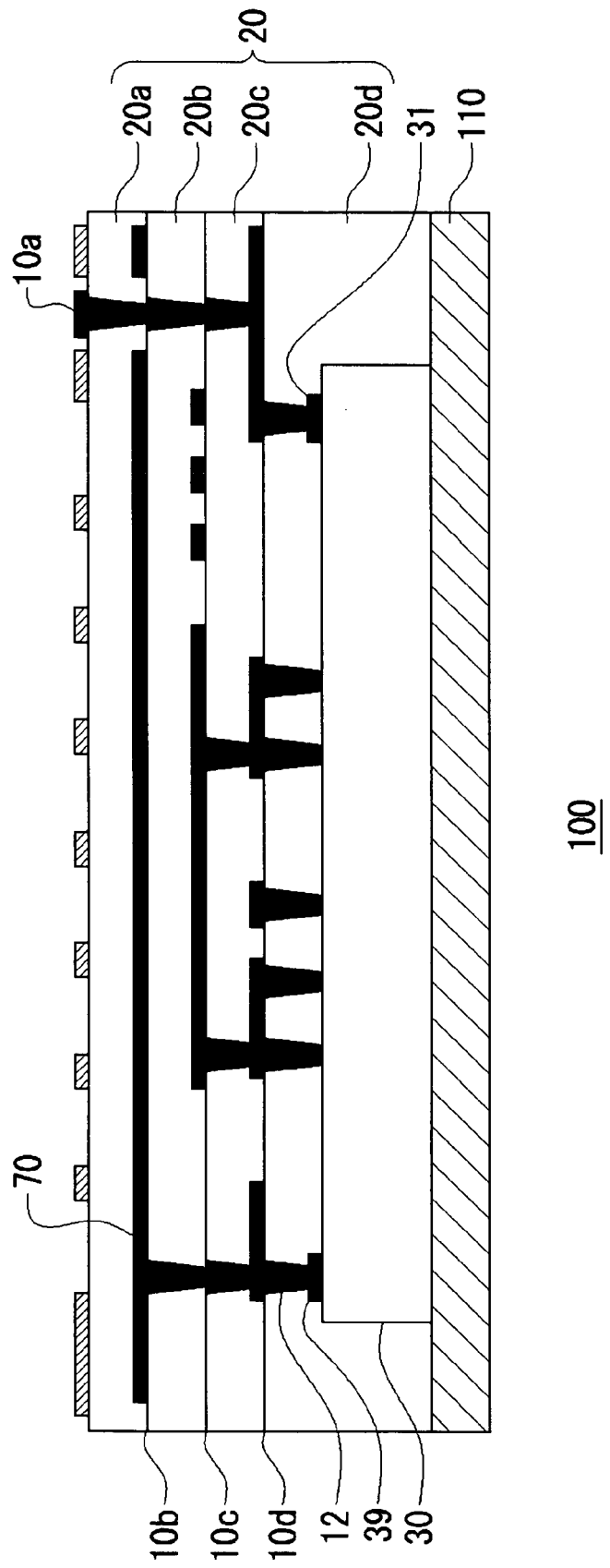
FIG. 8 is a sectional view showing the integrated antenna type circuit apparatus according to the fifth embodiment, taken along the line A-A' of FIG. 7.
Figure 9:
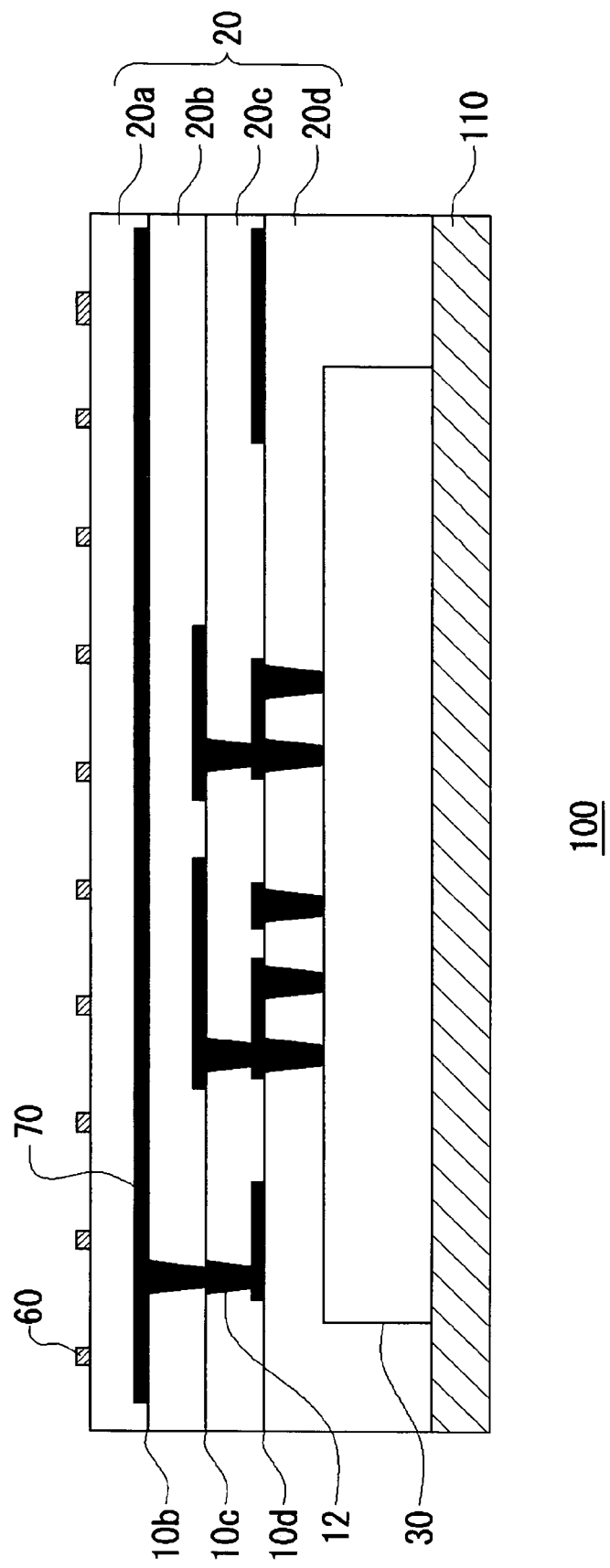
FIG. 9 is a sectional view showing the integrated antenna type circuit apparatus according to the fifth embodiment, taken along the line B-B' of FIG. 7.

FIG. 7 is a plan view showing the configuration of the integrated antenna type circuit apparatus 100 according to a fifth embodiment. FIGS. 8 and 9 are sectional views showing the configuration of the integrated antenna type circuit apparatus 100 according to the fifth embodiment, taken along the line A-A' and the line B-B' of FIG. 7, respectively. The integrated antenna type circuit apparatus 100 according to the present embodiment includes a base 110, an insulating base 20, a semiconductor circuit device 30, an antenna conductor 60, and a ground conductor 70.

As in the second embodiment, the base 110 may be made of, for example, epoxy resins, melamine derivatives such as BT resin, liquid crystal polymers, PPE resins, polyimide resins, fluorine-based resins, phenol resins, polyamide bismaleimide, or the like.

The base 110 has the semiconductor circuit device 30 die-bonded thereto. The semiconductor circuit device 30 is embedded in an insulator layer 20d.

More specifically, the semiconductor circuit device 30 of the present embodiment is an RFID chip. An RFID chip is a noncontact IC card-like device of yet smaller size, sophisticated function, and batteryless structure, and is available to identify various objects. The RFID chip does not incorporate any battery cell, and secures electric power necessary for operation by rectifying some of the electromagnetic waves transmitted from a reader-writer.

The insulating base 20 has a multilayer structure, being formed by laminating a plurality of insulator layers 20a to 20d. These insulator layers 20a to 20d may be made of the same material, or respectively different materials. The examples of the available materials include epoxy resins, melamine derivatives such as BT resin, liquid crystal polymers, PPE resins, polyimide resins, fluorine-based resins, phenol resins, and polyamide bismaleimide.

Wiring conductors 10a to 10d are formed in respective predetermined patterns on the insulator layers 20a to 20d. The insulator layers 20a to 20d are provided with a plurality of via plugs 12. The plurality of via plugs 12 establish connection between the wiring conductors 10a to 10d and electrode plugs of the semiconductor circuit device 30.

The wiring conductor 10a is electrically connected to the antenna conductor 60. The wiring conductor 10a and the feeding electrode plug 31 of the semiconductor circuit device 30 are electrically connected to each other through a plurality of via plugs 12 and the wiring conductors 10b to 10d. In the present embodiment, the wiring conductor 10a serves as a feeding point for establishing electric connection between the antennal conductor 60 and the semiconductor circuit device 30.

The antenna conductor 60 receives a carrier transmitted from the reader-writer. The antenna conductor 60 is formed on the side opposite from the base 110 on which the semiconductor circuit device 30 is mounted. The wiring conductor 10b next to the antenna conductor 60 is provided with the ground conductor 70 so that it overlaps with the antenna conductor 60. The ground conductor 70 and a ground electrode plug 39 of the semiconductor circuit device 30 are electrically connected to each other through a plurality of via plugs 12 and the wiring conductors 10b to 10d.

As above, according to the present embodiment, there is provided an integrated antenna type passive RFID in which: the semiconductor circuit device 30 (RFID chip) is embedded in the insulator layer 20d; the antenna conductor 60 is formed on the side opposite from the base 110; and the ground conductor 70 is interposed between the semiconductor circuit device 30 and the antenna conductor 60.

Figure 10:
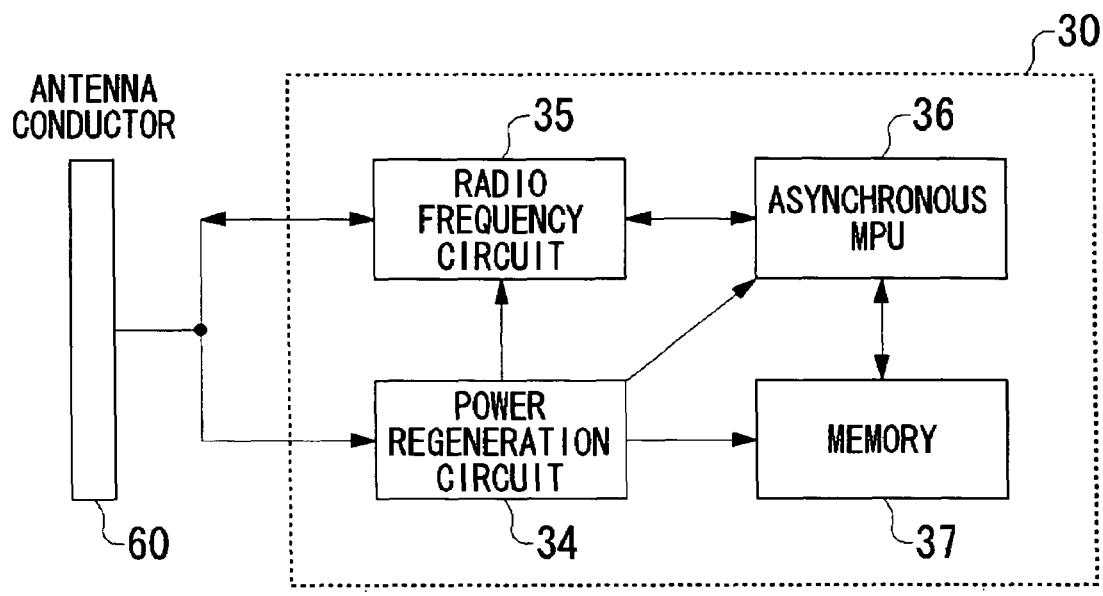
FIG. 10 is a functional block diagram showing the functional configuration of the semiconductor circuit device in the integrated antenna type circuit apparatus according to the fifth embodiment.

FIG. 10 is a functional block diagram showing the functional configuration of the semiconductor circuit device 30 according to the present embodiment. The semiconductor circuit device 30 includes a power regeneration circuit 34, a radio frequency circuit 35, an asynchronous MPU 36, and a memory 37.

The power regeneration circuit 34 rectifies the carrier received by the antenna conductor 60, and supplies the resulting power to the radio frequency circuit 35, the asynchronous MPU 36, and the memory 37 to be described later.

The radio frequency circuit 35 demodulates the carrier received by the antenna conductor 60 into coded data, and decodes the same. The decoded signal is transmitted to the asynchronous MPU 36. The radio frequency circuit 35 also receives a signal from the asynchronous MPU 36, encodes the received signal, and demodulates it to generate a carrier. The generated carrier is emitted from the antenna conductor 60, and received by the reader-writer.

The asynchronous MPU 36 is an MPU of asynchronous type, using no clock signal. The asynchronous MPU 36 controls information read and write from/to the memory 37 in accordance with the received signal.

The memory 37 stores information on an object or the like, the ID of the semiconductor circuit device 30, etc. The memory 37 may be either of a readable/writable recording medium (EEPROM: Electronically Erasable and Programmable Read Only Memory) and a read-only recording medium (ROM: Read Only Memory). If the memory 37 is a read-only recording medium, the asynchronous MPU 36 exercises control to read information from the memory 37.

According to the present embodiment, the lamination of the semiconductor circuit device (RFID chip) and the antenna conductor suppresses an increase in the packaging area. Moreover, the ground conductor interposed between the semiconductor circuit device and the antenna conductor improves the characteristics of the antenna, and blocks foreign noise from the surroundings. As a result, there is provided an integrated antenna type passive RFID which has excellent circuit characteristics.

Note that chip parts are omitted in the present embodiment. The insulating base 20 may implement a plurality of chip parts inside, so as to take charge of some of the functions of the semiconductor circuit device 30. In this case, the ground conductor 70 is interposed between the antenna conductor 60 and the radio frequency circuit composed of a plurality of chip parts. This can preclude the electromagnetic waves emitted from the antenna conductor 60 from affecting the semiconductor circuit device 30. The ground conductor 70 can also block external noise, and reduce unnecessary outgoing radiation from the semiconductor circuit device 30 as well.

The present invention is not limited to the foregoing embodiments, and various types of modifications including design changes may be made thereto based on the knowledge of those who skilled in the art. All such modified embodiments are also intended to fall within the scope of the present invention.

The embodiments have dealt with the cases where the ground conductor is formed on the wiring conductor layer adjacent to the antenna conductor, i.e., with one insulator layer therebetween. This is not restrictive, however. The ground conductor may be formed on a wiring conductor layer across two or more insulator layers from the antenna conductor. In this case, the wiring conductor layer for the ground conductor to be formed on can be selected to adjust the distance between the antenna conductor and the ground conductor. It is therefore possible to obtain desired antenna characteristics suitably.

The present invention may be applied to various types of apparatuses on which both an antenna and a radio frequency circuit are mounted in combination, such as a cellular phone, Personal Handyphone System, a wireless card, and a sensor for transmitting and receiving microwaves.

In the foregoing embodiments, the semiconductor circuit devices 30 and the chip parts 40 are mounted on the insulating base 20 or the base 110. Nevertheless, the present invention is also applicable to an ISB (Integrated System in Board, registered trademark) known as coreless SIP (System in Package), which has copper or other wiring patterns but no core for supporting the semiconductor circuit devices 30 and the like.

Sixth Embodiment

Technical Field of the Embodiment

The present embodiment relates to a semiconductor integrated circuit apparatus, and more particularly to a technology for reducing electromagnetic interference (EMI) of the semiconductor integrated circuit apparatus.

Background of the Embodiment

For the development of high speed digital electronic equipment, EMI controls are indispensable. The controls have been conventionally effected by taking some measures on printed-wiring boards, including devising the layout of signal wiring patterns and inserting anti-EMI components such as a capacitor intended for power supply decoupling. With recent improvements in speed and integration, however, it has become difficult to pass EMI regulations solely by the measures on the printed-wiring boards. The reason is that taking the conventional measures alone cannot reduce a noise current which is induced by the switching operations of circuit devices.

The noise current induced by the switching operations of circuit devices chiefly contains a basic clock frequency and higher harmonics thereof. This noise current propagates from inside the semiconductor integrated circuit apparatus to the power supply and ground lines of the printed-wiring board, so that the current paths trace a loop. This has caused the problem of EMI.

In terms of EMI control, it is thus of importance to prevent the noise current flowing from the semiconductor integrated circuit apparatus to the printed-wiring board.

Among conventional technologies against the EMI problem is the following.

"EMC in Digital Circuits," edited by Yamasaki Hiroo, first edition, Ohmsha Publishing, Nov. 2002, pp. 87-8, discloses a technology in which decoupling capacitors are mounted on near a semiconductor integrated circuit apparatus, so that the noise current occurring from circuit devices is prevented from flowing out to the printed-wiring board.

A first problem of this technology is that the semiconductor integrated circuit apparatus and the capacitors are wired through input/output pads of the circuit devices, bonding wires, packaging-board wiring, lead frames, and the printed-wiring board. This large wiring distance increases the serial parasitic inductances, precluding a sufficient decoupling effect of the capacitors.

A second problem of the technology is that the capacitors must be arranged near the semiconductor integrated circuit apparatus for the provision of the more decoupling effect, with a drop in the degree of flexibility in designing the wiring pattern of the printed-wiring board.

A third problem of the technology is that if the semiconductor integrated circuit apparatus has a plurality of power supply and ground terminals, the capacitors must be connected to the respective terminals. This increases the parts count and makes the printed-wiring board greater.

To address these problems, methods for arranging decoupling capacitors inside a semiconductor integrated circuit apparatus have been devised.

For example, Japanese Patent Laid-Open Publication No. 2002-57268 (hereinafter, referred to as patent document 3) discloses a method of arranging a plurality of chip capacitors on the same side as a package substrate provided with circuit devices is. This eliminates the need to attach external decoupling capacitors onto the printed-wiring board. As a result, it is possible to reduce the number of parts on the printed-wiring board and improve the degree of flexibility in designing the wiring pattern as well.

Japanese Patent Laid-Open Publication No. Hei 5-251635 (hereinafter, referred to as patent document 4) discloses a method of forming an array of thin film capacitors on circuit devices.

The conventional methods for arranging decoupling capacitors inside a semiconductor integrated circuit apparatus have the following problems.

A first problem is an increase in the packaging area, particularly when the circuit devices have a number of power supply and ground terminals. In the case of patent document 3, the packaging area increases because the plurality of chip capacitors are arranged on the same side as the packaging substrate provided with the circuit devices is. In the case of patent document 4, the packaging area increases since large areas are required in order to fabricate thin film capacitors that have high capacitances (of the order of nF) suitable for the provision of the decoupling effect. The increased packaging area leads directly to an increase in the manufacturing cost of the semiconductor integrated circuit apparatus.

A second problem, common to patent documents 3 and 4, is the lack of consideration for an EMI reduction in the radio-frequency domain (10 MHz to several hundreds of MHz), which is currently required of digital equipment. To be more specific, no consideration has been given to reducing the impedances of the power supply lines and ground lines connected to the capacitors in the radio-frequency domain.

A third problem, common to both patent documents 3 and 4, is the lack of consideration to variations in the capacitances and characteristics of the capacitors necessary for an EMI reduction. That is, when the semiconductor integrated circuit apparatus has a plurality of power supply and ground terminals, the power supply and ground terminals should produce respective different amounts of noise which are responsible for the variations.

The present invention has been achieved in view of the foregoing problems. It is thus an object of the present invention to provide a semiconductor integrated circuit apparatus capable of reducing EMI.

Means for Solving the Problems of the Present Embodiment

A semiconductor integrated circuit apparatus according to one of the aspects of the present embodiment comprises: an insulating resin film; a first circuit device embedded in the insulating resin film; a flat-shaped wiring layer of fixed potential, being formed on the insulating resin film above the first circuit device; and a second circuit device formed on the wiring layer. Here, the semiconductor integrated circuit apparatus refers to a package board or module board on which circuit devices are arranged. The circuit devices refer to semiconductor devices typified by an LSI chip.

According to this configuration, the second wiring layer interposed between the first circuit device and the second circuit device can shield the first circuit device from electromagnetic radiation from the second circuit device, with a reduction in EMI.

A semiconductor integrated circuit apparatus according to another aspect of the present embodiment comprises: an insulating resin film; a first circuit device embedded in the insulating resin film; a first wiring layer having one end connected to the first circuit device and the other end extended to reach a top of the insulating resin film; a second circuit device formed on the insulating resin film above the first circuit device; and a second wiring layer of fixed potential, being formed around the second circuit device.

According to this configuration, the second wiring layer arranged around the second circuit device can shield the first circuit device from electromagnetic radiation from the second circuit device, with a reduction in EMI.

In the foregoing configuration, a third wiring layer of variable potential may be further formed on the insulating resin film above the first circuit device so as to lie between the second circuit device and the second wiring layer.

In the foregoing configuration, the second wiring layer may have a wiring height greater than that of the third wiring layer. This allows more efficient shielding against the electromagnetic radiation from the second circuit device.

In the foregoing configuration, the second circuit device may be electrically connected with the second wiring layer or the third wiring layer. The first wiring layer may be electrically connected with the second wiring layer or the third wiring layer.

In the foregoing configuration, the first circuit device or the second circuit device may be a capacitive chip. This makes it possible to connect the power supply and ground terminals of the first circuit device or the second circuit device with capacitors intended for power supply decoupling, thereby allowing a further reduction in EMI.

In the foregoing configuration, the capacitive chip may include a plurality of capacitive device units, each of which can be controlled independently. Consequently, even when the semiconductor integrated circuit apparatus has a plurality of power supply and ground terminals, the plurality of power supply and ground terminals can be connected to a single capacitive chip. This allows the miniaturization of the semiconductor integrated circuit apparatus.

In the foregoing configuration, the plurality of capacitive device units may be arranged so that at least one of the capacitive device units differs from the other capacitive device units in the length across the terminals or in the terminal-to-terminal direction. This can improve the degree of flexibility in wiring of the semiconductor integrated circuit apparatus.

At least one of the capacitive device units may also differ from the other capacitive device units in longitudinal or lateral length. This can also improve the degree of flexibility in wiring the semiconductor integrated circuit apparatus.

The capacitive device units may be identical in longitudinal length, lateral length, and terminal positions.

In the foregoing configuration, the first circuit device or the second circuit device may be a capacitive chip including a plurality of capacitive device units. Here, at least one of the capacitive device units has a low-capacity capacitor and a high-capacity capacitor, and the low-capacity capacitor and the high-capacity capacitor are connected in parallel. This makes it possible to reduce EMI in the radio frequency domain (10 MHz to several hundreds of MHz) without increasing the parts count or increasing the packaging area.

In the foregoing configuration, the numbers of capacitive device units to be allocated for a pair of power supply and ground terminals of the first circuit device may be determined in advance depending on a decoupling capacitance necessary for the power supply and ground terminals to be connected to the terminals of the capacitive device unit(s). Consequently, a greater number of capacitive device units can be intensively allocated for the power supply and ground terminals that are in need of noise reduction. The capacitive devices and the packaging area can thus be reduced.

Incidentally, any appropriate combinations of the foregoing components are also intended to fall within the scope of the invention covered by a patent to be claimed by this patent application.

Best Examples for Carrying Out the Embodiment

Hereinafter, examples for carrying out the present embodiment will be described with reference to the drawings.

First Example

FIGS. 11A to 11E are sectional views showing the steps of manufacturing a semiconductor integrated circuit apparatus according to a first example.

Figure 11A:
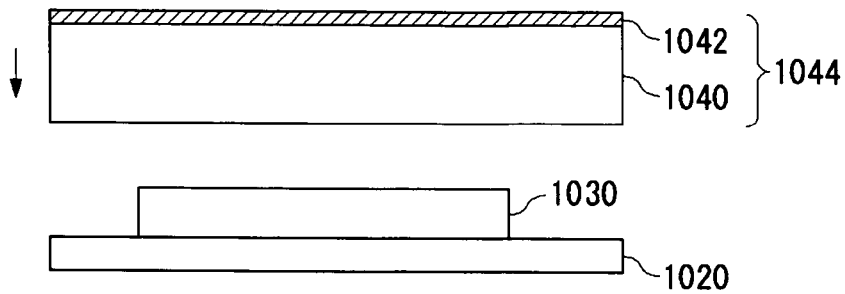
FIGS. 11A to 11E are sectional views showing the steps of manufacturing a semiconductor integrated circuit apparatus according to a first example.

Initially, as shown in FIG. 11A, a first LSI chip 1030 is fixed onto a base 1020. Here, the base 1020 may be a tape base having adhesiveness so that the first LSI chip 1030 can be fixed to its surface. The base 1020 may also be made of material that can be released from an insulating resin film 1040 after the first LSI chip 1030 is embedded in the insulating resin film 1040. An example of the available material is a PET film.

Figure 11B:
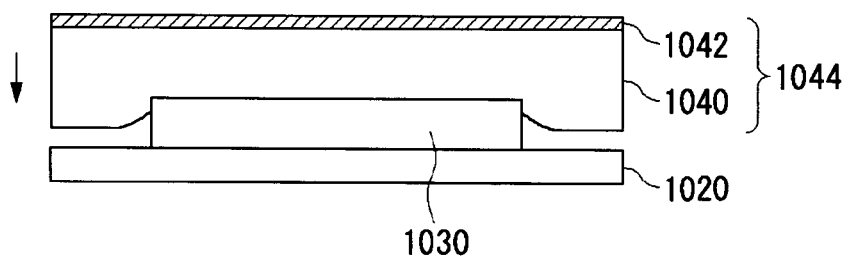

Next, as shown in FIG. 11B, a conductive-coated insulating resin film 1044 composed of a conductive film 1042 and the insulating resin film 1040 is placed on the base 1020 with the first LSI chip 1030 fixed thereto. The conductive-coated insulating resin film 1044 is pressed against the base 1020, whereby the first LSI chip 1030 is pressed into the insulating resin film 1040. Subsequently, the insulating resin film 1040 is heated under vacuum or under reduced pressure, so that it is pressure bonded to the base 1020. Consequently, as shown in FIG. 1C, the first LSI chip 1030 is embedded and pressure bonded into the insulating resin film 1040.

The conductive film 1042 is made of a rolled metal such as a rolled copper foil. The insulating resin film 1040 may be made of any material as long as it softens by heat. The examples of available materials include epoxy resins, melamine derivatives such as BT resin, liquid crystal polymers, PPE resins, polyimide resins, fluorine-based resins, phenol resins, and polyamide bismaleimide. The use of these materials can enhance the rigidity of the semiconductor module, whereby the semiconductor module is improved in stability. When the insulating resin film 1040 is made of a thermosetting resin such as epoxy resins, BT resin, PPE resins, polyimide resins, fluorine-based resins, phenol resins, and polyimide bismaleimide, the rigidity of the semiconductor integrated circuit apparatus can be enhanced further.

Among the examples of the epoxy resins are bisphenol-A type resin, bisphenol-F type resin, bisphenol-S type resin, phenol novolac resin, cresol novolac type epoxy resin, trisphenolmethane type epoxy resin, and alicyclic epoxy resin.

Among the examples of available melamine derivatives are melamine, melamine cyanurate, methylolated melamine, (iso)cyanurate, melam, melem, melon, succinoguanamine, melamine sulfate, acetoguanamine sulfate, melam sulfate, guanyl melamine sulfate, melamine resin, BT resin, cyanuric acid, isocyanuric acid, isocyanuric derivatives, melamine derivatives such as melamine isocyanurate, benzoguanamine, and acetoguanamine, and guanidine compounds.

Among the examples of the liquid crystal polymers are aromatic liquid crystal polyesters, polyimide, polyester amide, and resin compositions containing the same. Of these, liquid crystal polyesters or compositions containing the liquid crystal polyesters are preferable since they have heat resistance, workability, and moisture absorbability in excellent balance.

The examples of the liquid crystal polyesters include: (1) ones obtained from the reaction of aromatic dicarboxylic acid, aromatic diol, and aromatic hydroxycarboxylic acid; (2) ones obtained from the reaction of a combination of different types of aromatic hydroxycarboxylic acids; (3) ones obtained from the reaction of aromatic dicarboxylic acid and aromatic diol; and (4) ones obtained from the reaction of such polyester as polyethylene terephthalate with aromatic hydroxycarboxylic acid. Incidentally, the foregoing aromatic dicarboxylic acid, aromatic diol, and aromatic hydroxycarboxylic acid may be replaced with their ester derivatives. Moreover, the foregoing aromatic dicarboxylic acid, aromatic diol, and aromatic hydroxyl carboxylic acid may be replaced with ones in which the aromatic portions are substituted with halogen atom, an alkyl group, an aryl group, etc.

The examples of the repeating structural unit of the liquid crystal polyester include: ones derived from aromatic dicarboxylic acid (the following formula (i)); ones derived from aromatic diol (the following formula (ii)); and ones derived from aromatic hydroxycarboxylic acid (the following formula (iii)).

—CO-A1-CO— (i)

(where A1 represents a divalent linkage group containing an aromatic ring)

—O-A2-O— (ii)

(where A2 represents a divalent group containing an aromatic ring)

—CO-A3-O— (iii)

(where A3 represents a divalent group containing an aromatic ring)

The insulating resin films 1040 may contain fillers such as fibers. The examples of available fillers include particulates and fibers of $SiO_2$, $SiN$, $AlN$, and $Al_2O_3$. Including the fillers or fibers into the insulating resin film 1040 can reduce the warpage of the insulating resin film 1040 when the insulating resin film 1040 is heated to bond the first LSI chip 1030 by thermocompression and then cooled to room temperatures, for example. This can enhance the adhesiveness between the first LSI chip 1030 and the insulating resin film 1040. Including the fibers into the insulating resin film 1040 can improve the fluidity of the insulating resin film 1040. This makes it possible to enhance the adhesiveness between the insulating resin film 1040 and the first LSI chip 1030. In view of this, aramid nonwoven fabric is preferably used as the material for making the insulating resin film 1040. This allows favorable workability.

For aramid fibers, para-aramid fibers or meta-aramid fibers are available. For example, poly(p-phenylene terephthalamide) (PPD-T) may be used as the para-aramid fibers, and poly(m-phenylene isophthalamide) (MPD-I) as the meta-aramid.

The amount of the fillers contained in the material of the insulating resin film 1040 may be set as appropriate depending on the material. For example, a content of or below 50% by weight is applicable. This makes it possible to maintain favorable adhesiveness between the insulating resin film 1040 and the first LSI chip 1030.

The conductive-coated insulating resin film 1044 may be a sheet-like insulating resin film 1040 onto which the conductive film 1042 is attached. The conductive-coated insulating resin film 1044 may also be formed by applying a resin composition for making the insulating resin film 1040 onto the conductive film 1042, followed by drying. In this example, the resin composition may contain a hardening agent, a hardening accelerator, and other components without departing from the object of the embodiment. The conductive-coated insulating resin film 1044 is placed on the base 1020 with the insulating resin film 1040 in the B stage. This can enhance the adhesiveness between the insulating resin film 1040 and the first LSI chip 1030. Subsequently, the insulating resin film 1040 is heated in accordance with the type of the resin component of the insulating resin film 1040. Under vacuum or reduced pressure, the conductive-coated insulating resin film 1044 and the first LSI chip 1030 are bonded by pressure. In another case, the conductive-coated insulating resin film 1044 may be formed by placing a sheet of insulating resin film 1040, rendered in the B stage, on the base 1020. With the conductive film 1042 further placed thereon, the insulating resin film 1040 and the first LSI chip 1030 are then bonded by thermocompression, so that the conductive film 1042 is bonded to the insulating resin film 1040 at the same time.

In the manner described above, the conductive-coated insulating resin film 1044 is bonded to the first LSI chip 1030 by thermocompression so that the first LSI chip 1030 is embedded in the insulating resin film 1040. Then, as shown in FIG. 11D, the base 1020 is released from the insulating resin film 1040.

Subsequently, through holes are formed in the insulating resin film 1040. The through holes are filled with a conductive material to form vias 1050. Then, the conductive film 1042 is patterned to establish electric connection between the conductive film 1042 and the first LSI chip 1030. In this example, the conductive film 1042 is patterned into a flat shape so that it remains above the first LSI chip 1030. The flat-shaped conductive film 1042 is desirably greater than a second LSI chip 1032 to be described later. The flat-shaped conductive film 1042 is used as a wiring layer of fixed potential, such as one intended for ground or power supply. A conductive film 1042 of variable potential, such as one intended for signal lines, is also formed aside from the flat-shaped conductive film 1042. As shown in FIG. 11E, this forms a structure 1060 in which one of the sides of the first LSI chip 1030 is sealed with the insulating resin film 1040 and the other side is exposed. Incidentally, the potentials of the conductive films 1042 may be supplied from exterior, instead of being supplied from the first LSI chip 1030.

Since the first LSI chip 1030 is exposed at the side opposite from the sealed side, it is possible to release heat from the exposed side when the first LSI chip 1030 is operated to increase in temperature. It is therefore possible to provide a semiconductor module having favorable heat radiation characteristics. Moreover, a variety of cooling methods may also be applied thereto, including one in which a heat sink is arranged on the exposed side of the first LSI chip 1030 and one in which the exposed side is cooled by air.

Since the side of the first LSI chip 1030 opposite from the sealed side is not provided with any substrate or the like, it is possible to miniaturize the semiconductor module.

Figure 12A:
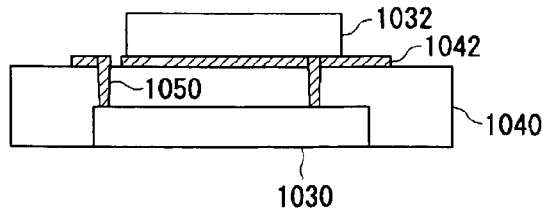
FIGS. 12A to 12E are sectional views showing the steps of manufacturing a semiconductor integrated circuit apparatus according to the first example.

Next, as shown in FIG. 12A, a second LSI chip 1032 is placed on the flat-shaped conductive film 1042 of the structure 1060 formed as described above. Here, an adhesive resin such as a silver paste can be interposed between the conductive film 1042 and the second LSI chip 1032 so that the second LSI chip 1032 is situated in a predetermined position.

Figure 12B:
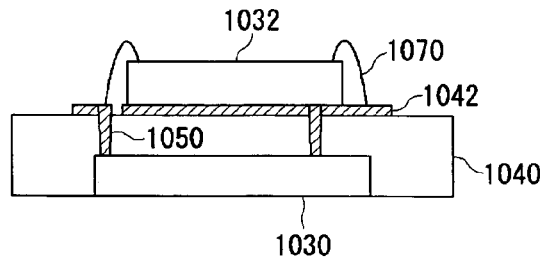
Figure 12C:
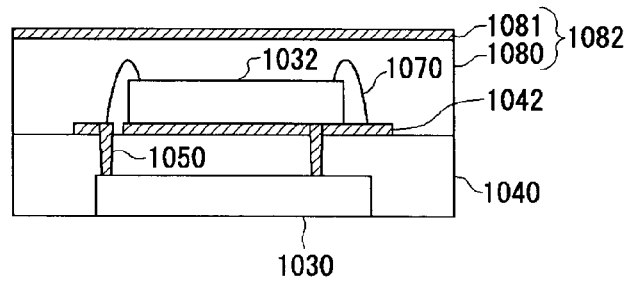

Next, as shown in FIG. 12B, the second LSI chip 1032 and the conductive film 1042 are electrically connected by wires 1070. Moreover, as shown in FIG. 12C, the second LSI chip 1032 is sealed with a conductive-coated insulating resin film 1082 which is composed of a conductive film 1081 and an insulating resin film 1080.

Figure 12D:
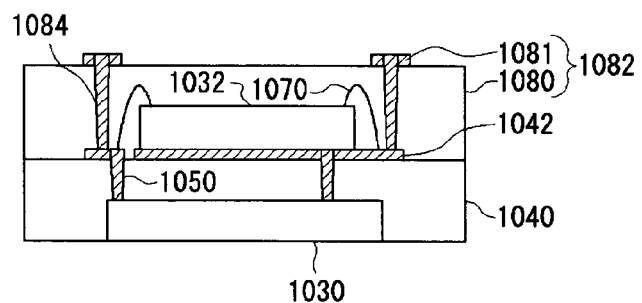

Then, as shown in FIG. 12D, through holes are formed in the insulating resin film 1080. The through holes are filled with a conductive material to form vias 1084, thereby establishing electric connection between the upper and lower layers. Subsequently, the conductive film 1081 is patterned to form wiring.

Figure 12E:
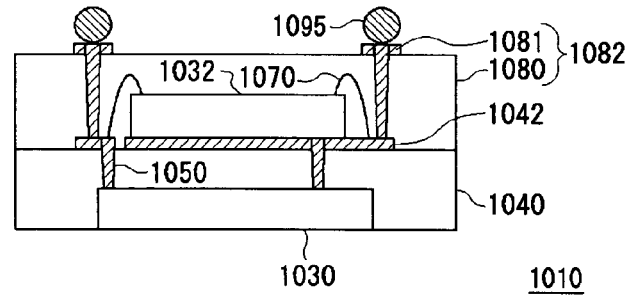

Next, as shown in FIG. 12E, solder balls 1095 are formed on the conductive film 1081 for the sake of electrode formation.

Through the foregoing steps, a semiconductor integrated circuit apparatus 1010 is obtained. Since the conductive film 1042 interposed between the first LSI chip 1030 and the second LSI chip 1032 shields the second LSI chip 1032 from the electromagnetic radiation from the first LSI chip 1030, EMI on the semiconductor integrated circuit apparatus 1010 is reduced.

Second Example

The manufacturing process of a semiconductor integrated circuit apparatus according to this example is the same as that of the semiconductor integrated circuit apparatus according to the first example, up to the step of FIG. 12A. Description will thus be given of the steps subsequent to FIG. 12A.

Figure 13A:
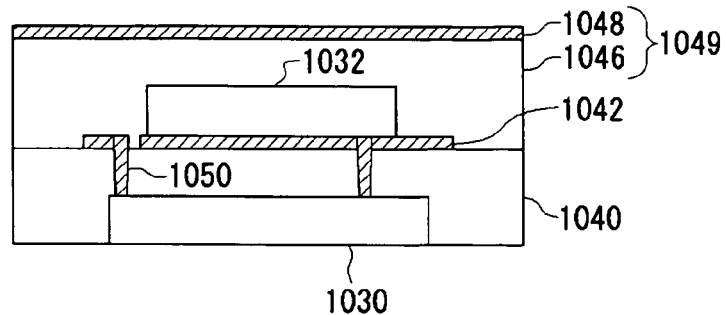
FIGS. 13A to 13D are sectional views showing the steps of manufacturing a semiconductor integrated circuit apparatus according to a second example.

After the step shown in FIG. 12A, the second LSI chip 1032 is sealed with an insulating resin film 1046 as shown in FIG. 13A. Specifically, a conductive-coated insulating resin film 1049 composed of a conductive film 1048 and the insulating resin film 1046 is placed on the insulating resin film 1040. The conductive-coated insulating resin film 1049 is then pressed against the insulating resin film 1042 so that the second LSI chip 1032 is pressed into the insulating resin film 1046. Subsequently, the insulating resin film 1046 is heated under vacuum or under reduced pressure, and bonded to the insulating resin film 1040 by pressure. Consequently, as shown in FIG. 13A, the second LSI chip 1032 is embedded and pressure bonded into the insulating resin film 1046.

Figure 13B:
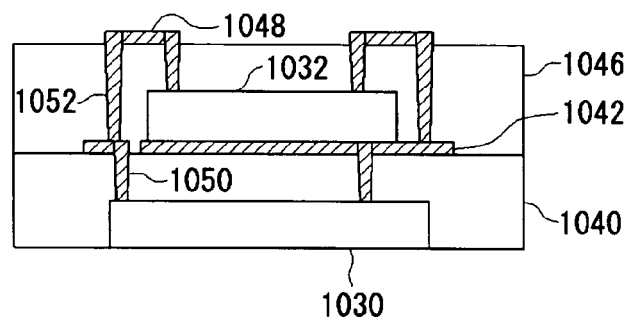

Then, as shown in FIG. 13B, through holes are formed in the insulating resin film 1046. The through holes are filled with a conductive material to form vias 1052. Subsequently, the conductive film 1048 is patterned to establish electric connection between the conductive film 1042 and the second LSI chip 1032.

Figure 13C:
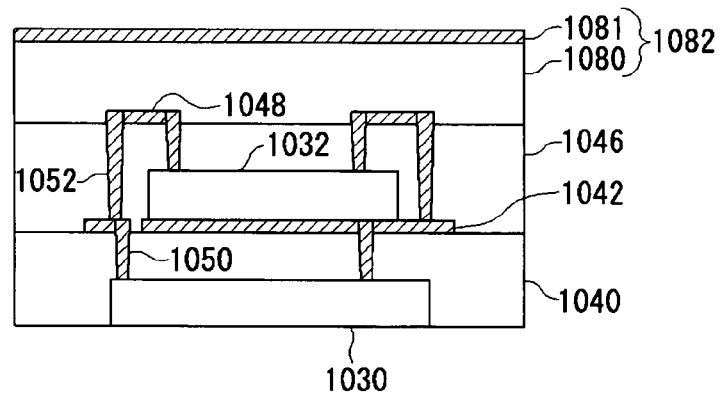

Next, as shown in FIG. 13C, the conductive film 1048 on the insulating resin film 1046 is sealed with a conductive-coated insulating resin film 1082 which is composed of a conductive film 1081 and an insulating resin film 1080.

Figure 13D:
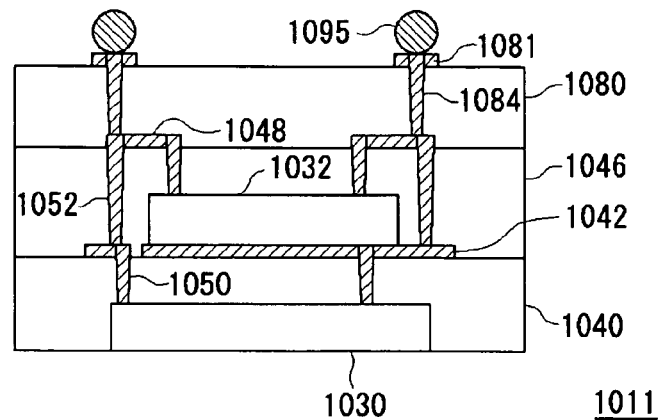

Then, as shown in FIG. 13D, through holes are formed in the insulating resin film 1080. The through holes are filled with a conductive material to form vias 1084, thereby establishing electric connection between the upper and lower layers. Subsequently, the conductive film 1081 is patterned to form wiring. Furthermore, solder balls 1095 are formed on the conductive film 1081 for the sake of electrode formation.

Through the foregoing steps, a semiconductor integrated circuit apparatus 1011 is obtained. Since the conductive film 1042 interposed between the first LSI chip 1030 and the second LSI chip 1032 shields the second LSI chip 1032 from the electromagnetic radiation from the first LSI chip 1030, EMI on the semiconductor integrated circuit apparatus 1011 is reduced.

Third Example

Figure 11C:
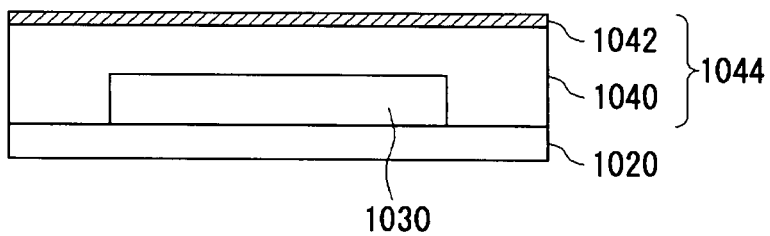
Figure 11D:
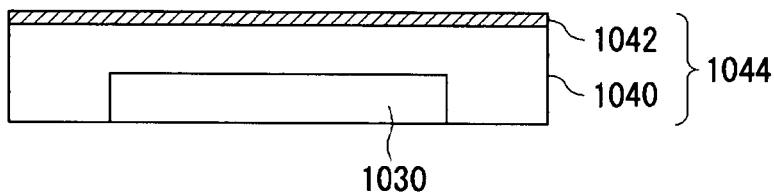
Figure 11E:
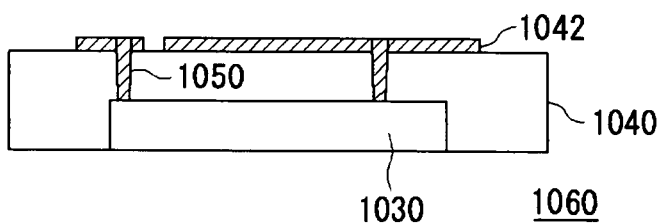

The manufacturing process of a semiconductor integrated circuit apparatus according to this example is the same as that of the semiconductor integrated circuit apparatus according to the first example, up to the step of FIG. 11C. Description will thus be given of the steps subsequent to FIG. 11C.

Figure 14A:
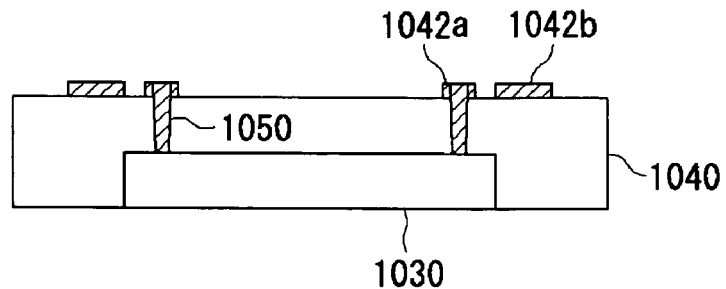
FIGS. 14A to 14D are sectional views showing the steps of manufacturing a semiconductor integrated circuit apparatus according to a third example.

After the step shown in FIG. 11C, through holes are formed in the insulating resin film 1040 as shown in FIG. 14A. The through holes are filled with a conductive material to form vias 1050. Subsequently, the conductive film 1042 is patterned to form a signal-line conductive film 1042a and a power-supply conductive film 1042b. The signal-line conductive film 1042a is electrically connected to the first LSI chip 1030. Here, the power-supply conductive film 1042b desirably has a width greater than that of the signal-line conductive film 1042a. This allows more efficient shielding against the electromagnetic radiation from the second LSI chip 1032. Incidentally, the conductive film 1042a is not limited to the signal-line wiring layer, but may be used as any wiring layer of variable potential. Moreover, the conductive film 1042b is not limited to the power-supply wiring layer, but may be any wiring layer of fixed potential. For example, it may be used as a ground wiring layer.

Figure 14B:
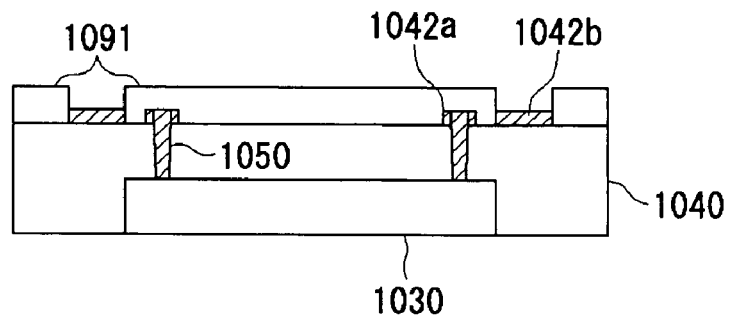

Next, as shown in FIG. 14B, the areas other than the power-supply conductive film 1042b are masked by the application of a resist 1091, followed by exposure and development. As a result, openings are formed above the power-supply conductive film 1042b.

Figure 14C:
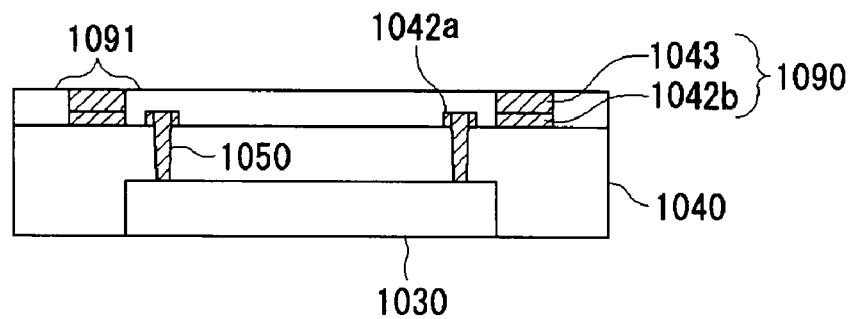

Next, as shown in FIG. 14C, the openings in the resist 1091 are filled with a conductive member 1043 of copper or the like by electrolytic plating. A power supply layer 1090 is thus formed by the conductive film 1042b and the conductive member 1043. When the power supply layer 1090 is thus given a height greater than that of the conductive film 1042a intended for signal lines, more efficient shielding can be exercised against the electromagnetic radiation from the second LSI chip 1032.

Figure 14D:
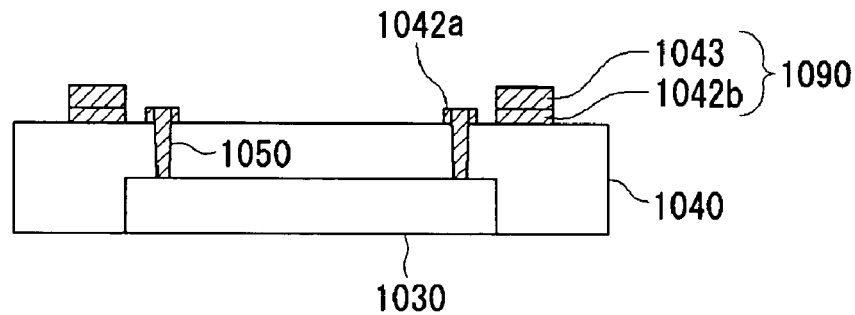

Next, as shown in FIG. 14D, the resist 1091 is removed to form a structure 1062.

Figure 15A:
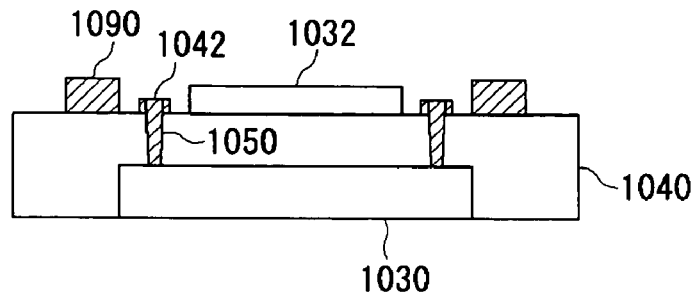
FIGS. 15A to 15D are sectional views showing the steps of manufacturing a semiconductor integrated circuit apparatus according to the third example.

Next, as shown in FIG. 15A, the second LSI chip 1032 is placed on the structure 1062 formed thus, inside the conductive film 1042a. Here, an adhesive resin such as a silver paste can be interposed between the conductive film 1042 and the second LSI chip 1032 so that the second LSI chip 1032 is situated in a predetermined position.

Figure 15B:
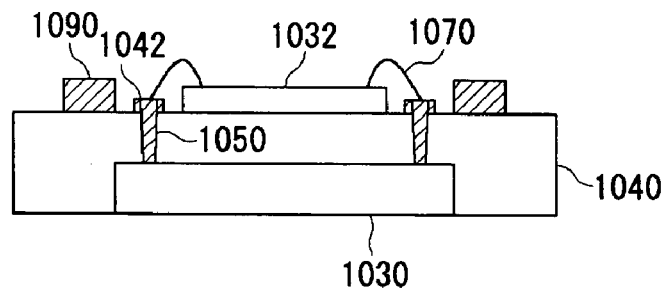
Figure 15C:
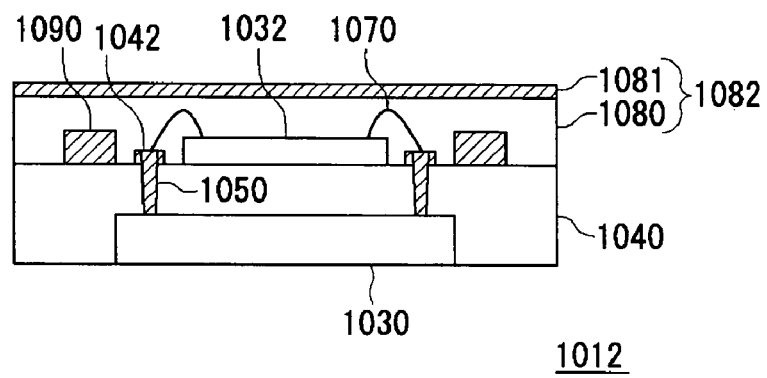

Next, as shown in FIG. 15B, the second LSI chip 1032 and the conductive film 1042 are electrically connected by wires 1070. Moreover, as shown in FIG. 15C, the second LSI chip 1032 is sealed with a conductive-coated insulating resin film 1082 which is composed of a conductive film 1081 and an insulating resin film 1080.

Figure 15D:
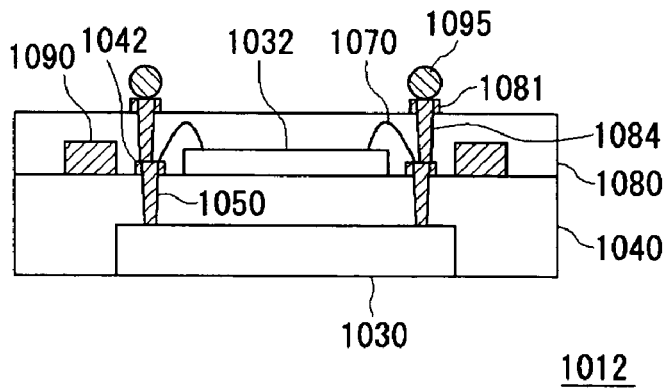

Then, as shown in FIG. 15D, through holes are formed in the insulating resin film 1080. The through holes are filled with a conductive material to form vias 1084, thereby establishing electric connection between the upper and lower layers. Subsequently, the conductive film 1081 is patterned to form wiring. Furthermore, solder balls 1095 are formed on the conductive film 1081 for the sake of electrode formation.

Through the foregoing steps, a semiconductor integrated circuit apparatus 1012 is obtained.

Fourth Example

The manufacturing process of a semiconductor integrated circuit apparatus according to this example is the same as that of the semiconductor integrated circuit apparatus according to the third example, up to the step of FIG. 15A. Description will thus be given of the steps subsequent to FIG. 15A.

Figure 16A:
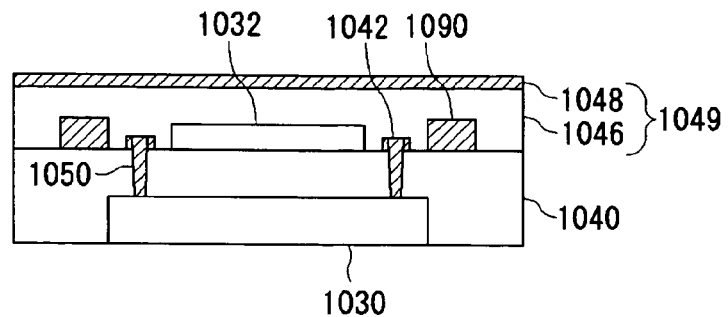
FIGS. 16A to 16D are sectional views showing the steps of manufacturing a semiconductor integrated circuit apparatus according to a fourth example.

After the step shown in FIG. 15A, the second LSI chip 1032 is sealed with an insulating resin film 1046 as shown in FIG. 16A. Specifically, a conductive-coated insulating resin film 1049 composed of a conductive film 1048 and the insulating resin film 1046 is placed on the insulating resin film 1040. The conductive-coated insulating resin film 1049 is then pressed against the insulating resin film 1042 so that the second LSI chip 1032 is pressed into the insulating resin film 1046. Subsequently, the insulating resin film 1046 is heated under vacuum or under reduced pressure, so that it is pressure bonded to the insulating resin film 1040. Consequently, as shown in FIG. 16A, the second LSI chip 1032 is embedded and pressure bonded into the insulating resin film 1046.

Figure 16B:
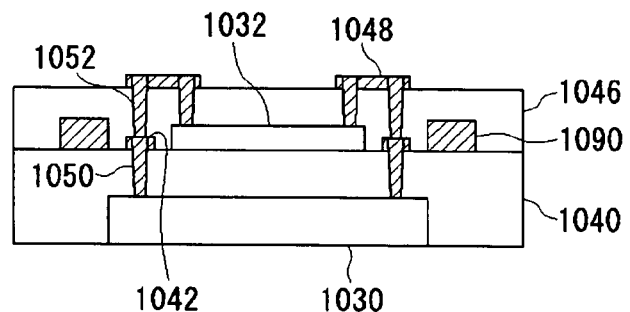

Then, as shown in FIG. 16B, through holes are formed in the insulating resin film 1046. The through holes are filled with a conductive material to form vias 1052. Subsequently, the conductive film 1048 is patterned to establish electric connection with the second LSI chip 1032.

Figure 16C:
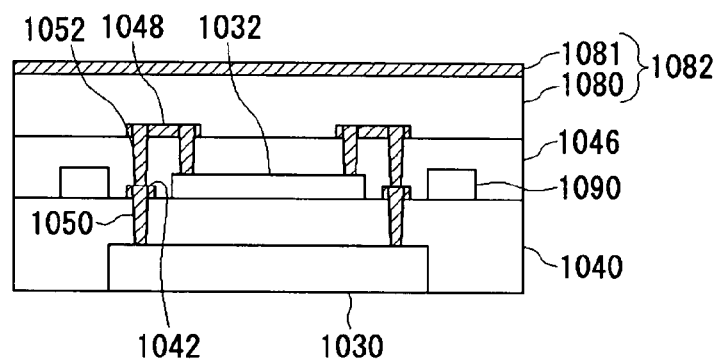

Next, as shown in FIG. 16C, the conductive film 1048 is sealed with a conductive-coated insulating resin film 1082 which is composed of a conductive film 1081 and an insulating resin film 1080.

Figure 16D:
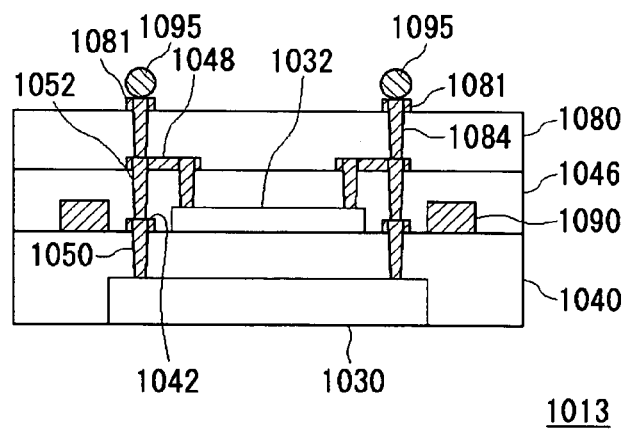

Then, as shown in FIG. 16D, through holes are formed in the insulating resin film 1080. The through holes are filled with a conductive material to form vias 1084, thereby establishing electric connection between the upper and lower layers. Subsequently, the conductive film 1081 is patterned to form wiring. Furthermore, solder balls 1095 are formed on the conductive film 1081 for the sake of electrode formation.

Through the foregoing steps, a semiconductor integrated circuit apparatus 1013 is obtained.

(Mode of Shielding of Second LSI Chip)

Figure 17A:
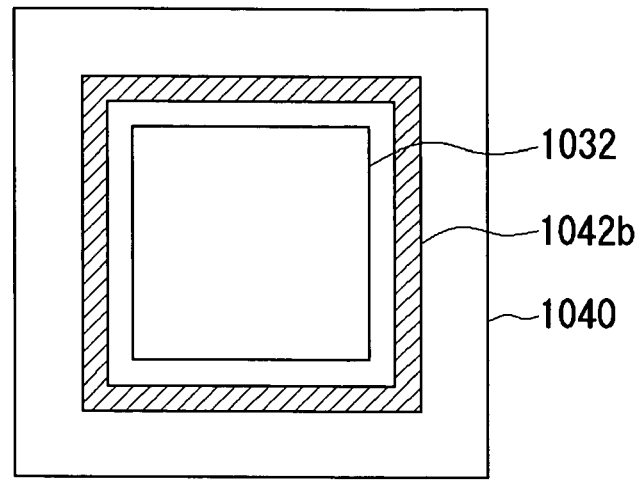
FIGS. 17A to 17C are plan views showing the layout of a second LSI chip and conductor films according to the third or fourth example.
Figure 17B:
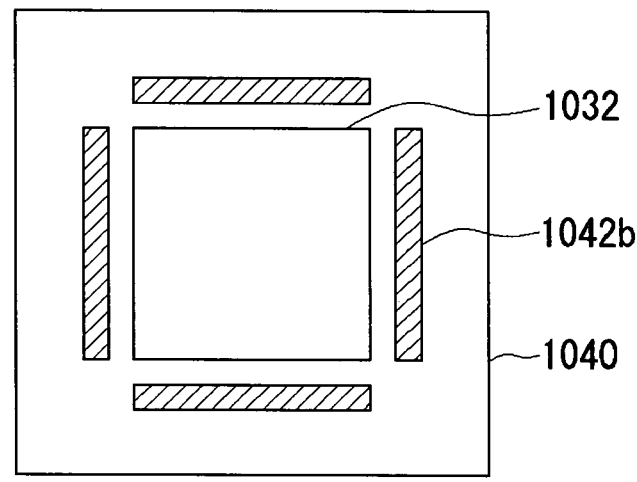
Figure 17C:
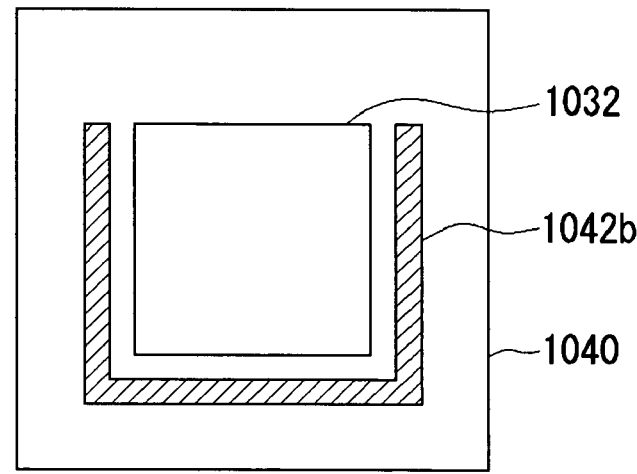

FIGS. 17A to 17C are plan views showing the modes of shielding the second LSI chip according to the third or fourth example. In FIG. 17A, the second LSI chip 1032 is surrounded by a power-supply conductive film 1042b of fixed potential. In FIG. 17B, conductive films 1042b of straight shape are arranged along the respective sides of the second LSI chip 1032. In FIG. 17C, a conductive film 1042b of U shape is formed around the second LSI chip 1032.

As shown in FIGS. 17A to 17C, the conductive film(s) 1042b is/are arranged around the second LSI chip 1032. The first LSI chip 1030 can thus be effectively shielded from the electromagnetic radiation from the second LSI chip 1032, with a reduction in EMI. Incidentally, the technical concept as to the shielding of the second LSI chip 1032 may also be applied to the first LSI chip 1030. For example, a wiring layer of fixed potential, such as ground, can be formed around the first LSI chip 1030 to allow more efficient shielding against the electromagnetic radiation from the first LSI chip 1030. Moreover, when the wiring layer of fixed potential, such as ground, is formed around the second LSI chip 1032, it is possible to provide shielding not only against the electromagnetic radiation from the second LSI chip but also against the electromagnetic radiation from the first LSI chip 1030.

(Concrete Examples of Second LSI Chip)

Figure 18:
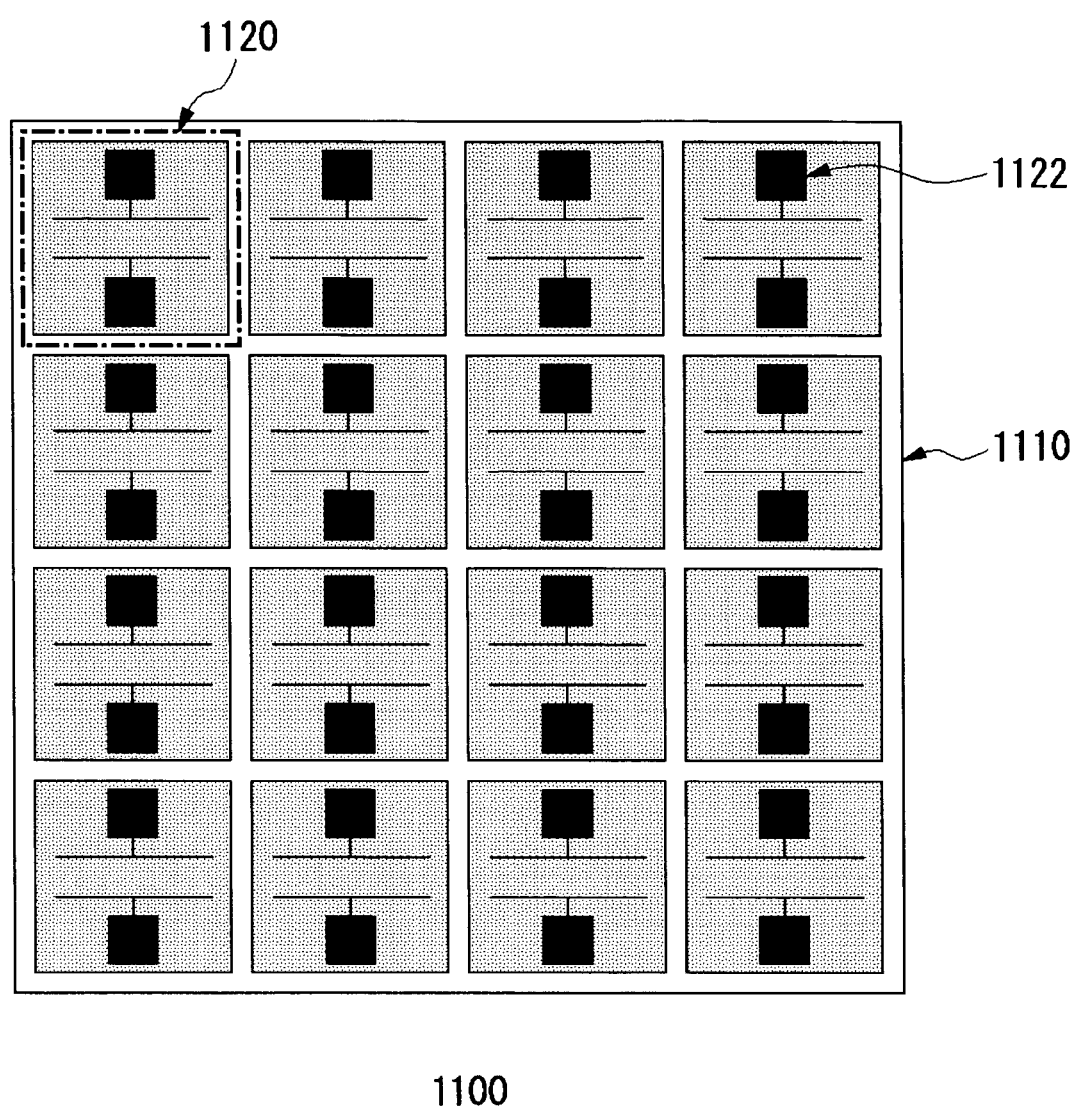
FIG. 18 is a plan view of a capacitive chip.

When the first LSI chip 1030 or the second LSI chip 1032 is a capacitive chip, it becomes possible to connect the power supply and ground terminals of the first LSI chip 1030 or the second LSI chip 1032 with capacitors intended for power supply decoupling. This allows a further reduction in EMI. FIG. 18 is a plan view of a capacitive chip. The capacitive chip 1100 of this example has a silicon substrate 1110 and a plurality of capacitive device units 1120 of the same model which are formed in an array on the silicon substrate 1110. Here, the same model refers to that the capacitive device units 1120 are identical in longitudinal length, lateral width, and terminal positions. In the capacitive chip 1100 of this example, each of the plurality of capacitive device units 1120 can be controlled independently. The capacitive device units 1120 are accompanied with respective IO pads 1122. Consequently, even when the semiconductor integrated circuit has a plurality of power supply terminals and ground terminals, the plurality of power supply terminals and ground terminals can be connected to the single capacitive chip.

Figure 19:
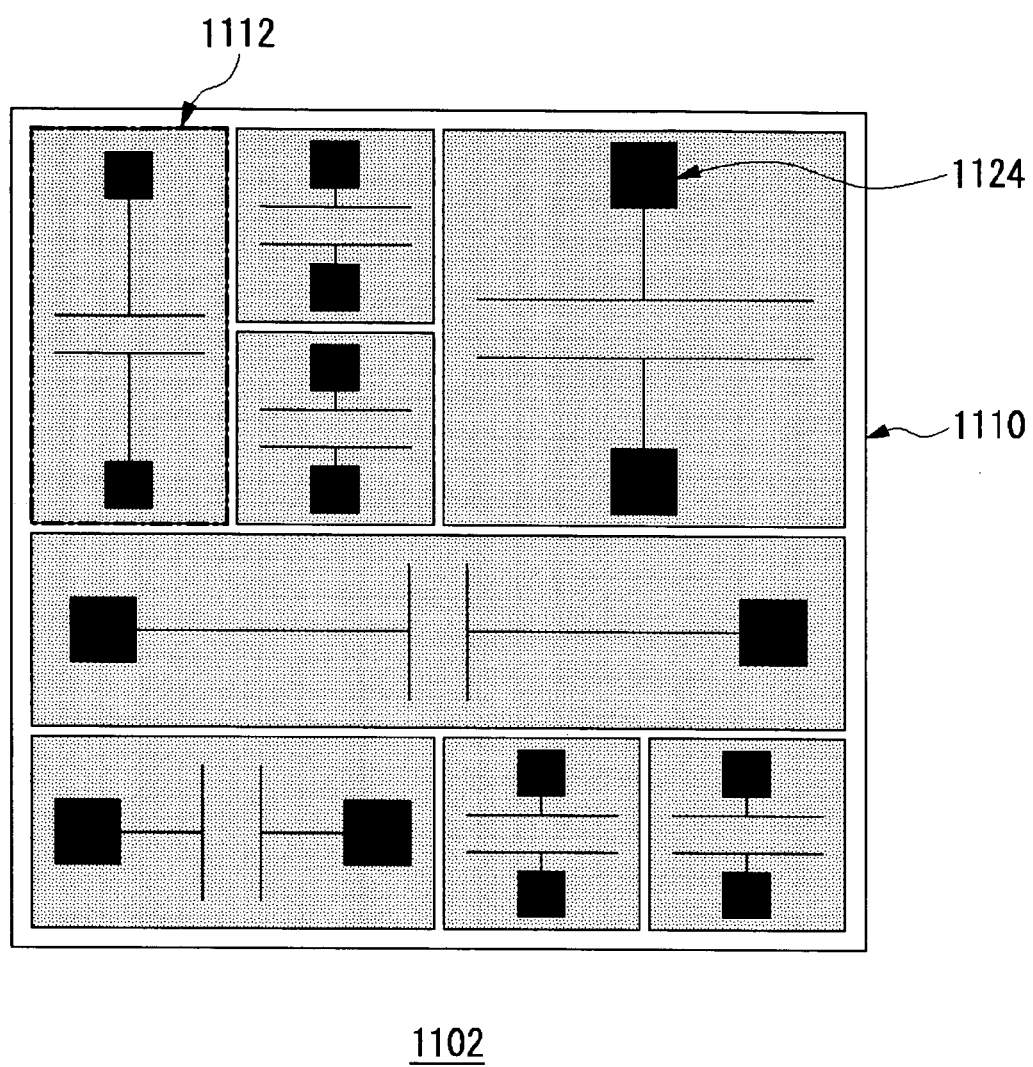
FIG. 19 is a plan view of another capacitive chip.

FIG. 19 is a plan view of another capacitive chip. The capacitive chip 1102 of this example has capacitive device units 1112 of various shapes which are formed on a silicon substrate 1110. As is the case with the foregoing capacitive chip 1100, each of the capacitive device units 1112 can be controlled independently. The capacitive device units 1112 are accompanies with IO pads 1124. In the capacitive chip 1102 of this example, the plurality of capacitive device units 1112 are arranged so that at least one of the capacitive device units 1112 differs from the other capacitive device units 1112 in the length across the terminals or in the terminal-to-terminal direction. This can improve the degree of flexibility in wiring the semiconductor integrated circuit apparatus. Moreover, the degree of flexibility in wiring the semiconductor integrated circuit apparatus can also be improved by using a capacitive chip 1100 in which at least one of the capacitive device units 1112 has a longitudinal or lateral length different from that of the other capacitive device units.

(Method of Manufacturing Capacitive Chip)

FIGS. 20A to 20F are sectional views showing the steps of manufacturing the capacitive chip shown in FIG. 18. The capacitive chip shown in FIG. 19 can also be fabricated by this manufacturing method.

Figure 20A:
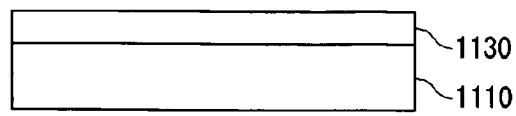
FIGS. 20A to 20F are sectional views showing the steps of manufacturing a capacitive chip.

Initially, as shown in FIG. 20A, a first insulating film 1130 is formed on the silicon substrate 1110 by plasma CVD, thermal diffusion, or SOG (Spin On Glass). The first insulating film 1130 may be made of silicon oxide, for example.

Figure 20B:
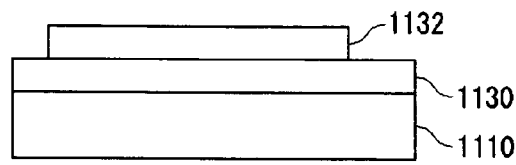

Next, a first conductive layer 1132 is deposited on the first insulating film 1130. The first conductive layer 1132 is made of poly-Si. A resist is applied onto the first conductive layer 1132, followed by exposure for patterning the capacitive devices. In areas not covered with the resist, the first conductive layer 1132 is removed by plasma etching. Subsequently, the resist is removed to form the first conductive layer 1132 as shown in FIG. 20B.

Figure 20C:
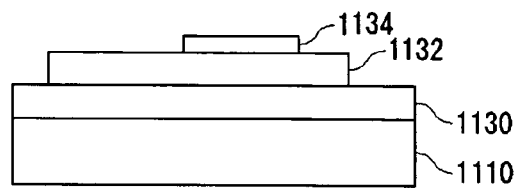

Next, a dielectric layer 1134 is deposited on the first conductive layer 1132. The dielectric layer 1134 may be made of such materials as $HfO_2$ (hafnium oxide), $Al_2O_3$ (alumina), and AlN (aluminum nitride). The dielectric layer 1134 deposited is patterned by photoresist techniques (FIG. 20C).

Figure 20D:
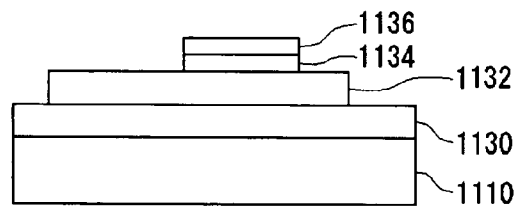

Next, as shown in FIG. 20D, a second conductive layer 1136 is formed on the dielectric layer 1134. The second conductive layer 1136 is made of W—Si (tungsten silicide), for example. The second conductive layer 1136 deposited is patterned by photoresist techniques.

Figure 20E:
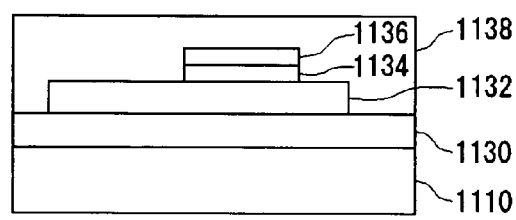

Next, as shown in FIG. 20E, a second insulating film 1138 is formed over the first insulating film 1130 by plasma CVD or SOG. This seals the first conductive layer 1132, the dielectric layer 1134, and the second conductive layer 1136.

Figure 20F:
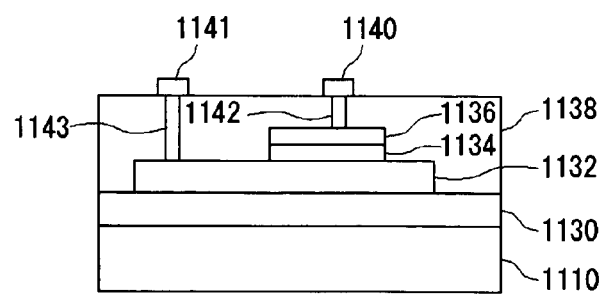

Next, as shown in FIG. 20F, bottom electrodes 1141 to be connected to the first conducive layer 1132 through vias 1143 are formed on the second insulating layer 1138. Top electrodes 1140 to be connected to the second conductive layer 1136 through vias 1142 are also formed on the second insulating film 1138. The top electrodes 1140 and the bottom electrodes 1141 may be made of copper, for example.

For example, the top electrodes 1140 and the bottom electrodes 1141 are fabricated by the following procedure:
(1) Apply a resist onto the second insulating film 1138, followed by exposure to open via areas;
(2) Remove the second insulating film 1138 in the opened via areas by plasma etching;
(3) Remove the resist;
(4) Form a barrier metal film and a copper film in the vias 1142 and 1143 by sputtering. Then, fill the vias with copper by electrolytic plating; and
(5) Pattern the top electrodes 1140 and the bottom electrodes 1141. Specifically, a resist is applied again onto the copper film, and then exposure is conducted to open the areas other than the electrode areas. Then, the opened areas are etched with a ferric chloride solution, thereby removing the resist.

Aside from the foregoing procedure, the top electrodes 1140 and the bottom electrodes 1141 may also be formed by dual damascening.

(Configuration of Capacitive Device Unit)

Figure 21:
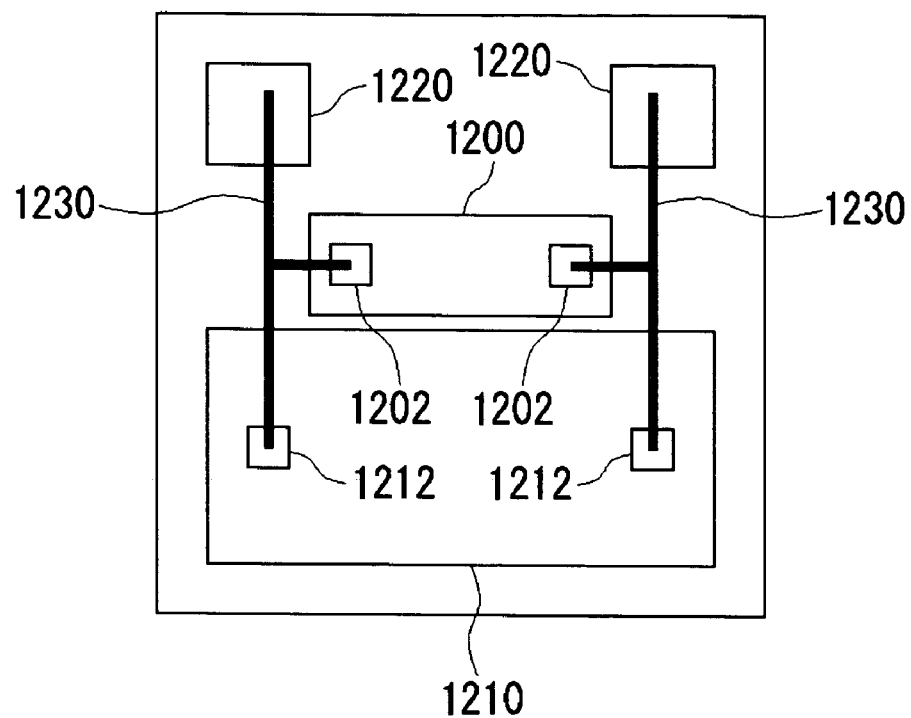
FIG. 21 is a diagram showing an example of a capacitive device unit.

FIG. 21 shows an example of a capacitive device unit. As shown in FIG. 21, a capacitive device unit 1114 includes a low-capacity capacitor 1200 having favorable high-frequency characteristics, a high-capacity capacitor 1210 having favorable low-frequency characteristics, and a pair of external connection pads 1220. The low-capacity capacitor 1200 has a pair of electrodes 1202, and the high-capacity capacitor 1210 a pair of electrodes 1212. With wiring 1230 for establishing connection to the external connection pads 1220, the low-capacity capacitor 1200 and the high-capacity capacitor 1210 are connected in parallel. The low-capacity capacitor 1200 having favorable high-frequency characteristics is arranged closer to the external connection pads 1220. When the capacitive device unit 1114 having such a configuration is connected with a power supply and a ground, it is possible to reduce EMI in the radio frequency domain (10 MHz to several hundreds of MHz) without increasing the parts count or increasing the packaging area.

(Method of Reducing EMI)

Now, the method of reducing EMI will be described for situations where the foregoing capacitive chip is applied to the second LSI chip.

Figure 22A:
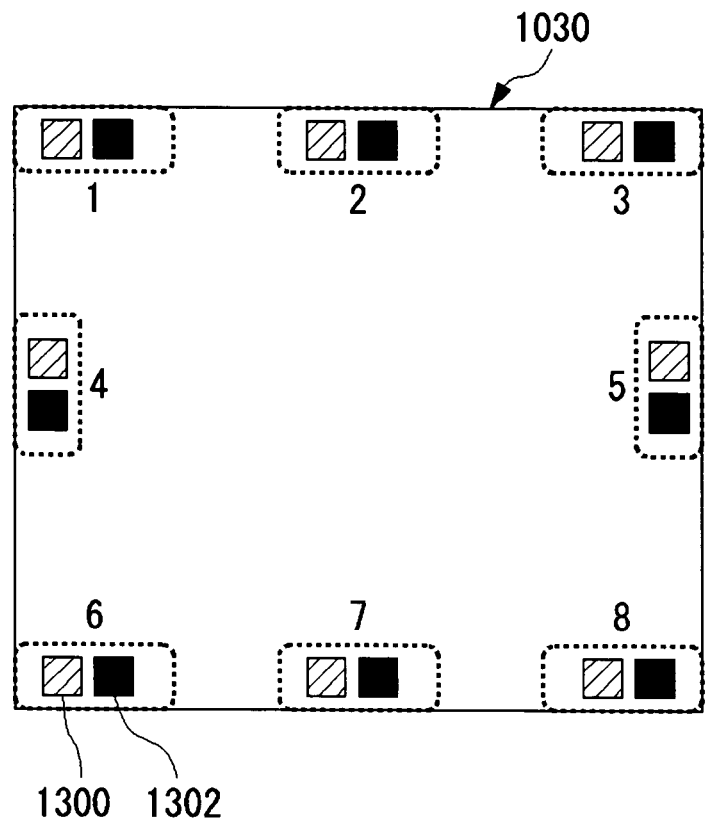
FIGS. 22A and 22B are diagrams showing the modes of pairing the power supply and ground terminals of an LSI chip.
Figure 22B:
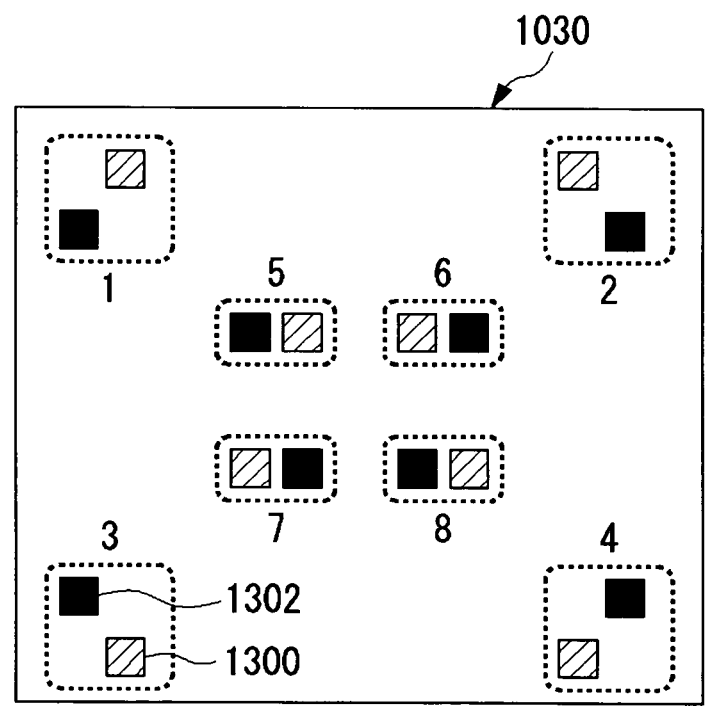

Initially, FIGS. 22A and 22B show examples of pairing of the power supply and ground terminals of the first LSI chip. The first LSI chip 1030 shown in FIG. 22A is an LSI of peripheral IO type, in which IO terminals are arranged in the chip periphery. The first LSI chip 1030 shown in FIG. 22B is an LSI of area IO type, in which IO terminals are distributed to predetermined areas. With the area IO type, wafer level rewiring may sometimes be formed. In either of these examples, the number of pairs of power supply and ground terminals 1300 and 1302 is eight, whereas this number is not restrictive. Moreover, in the examples, the power supply terminals 1300 and the ground-terminals 1302 are paired up one by one, though not necessarily. For example, either or both of the terminals may be grouped in two or more. More specifically, one power supply terminal and two ground terminals may be coupled up. Two power supply terminals and two ground terminals may also be grouped together.

FIG. 23 shows examples of the numbers of capacitive units necessary for respective supply-ground pairs. The data shown in FIG. 23 indicates EMI measurements and simulation-based values on the respective power supply terminals. The figures are not restrictive, however. In this example, pair numbers 3 and 4 are high in EMI level (rank A), requiring intensive noise control. The numbers of capacitive device units to be connected are thus set at 10. Pair number 5 is medium in EMI level (rank B). The number of units is thus six. Pair numbers 1, 6, and 7 are relatively low in EMI level (rank C). The numbers of units are thus two. Finally, pair numbers 2 and 8 are slight in EMI level, so that no capacitive device unit will be connected.

Figure 24:
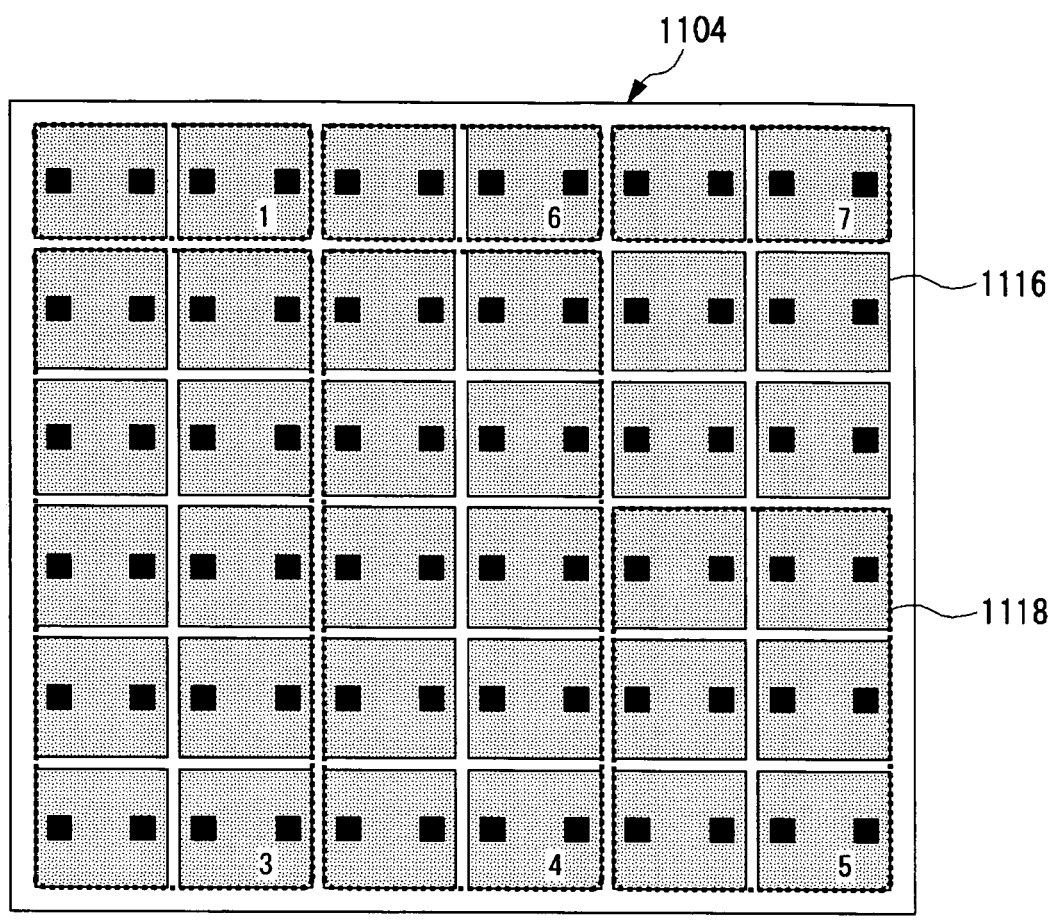
FIG. 24 is a diagram showing an example of unit allocation for the individual power supply terminals and ground terminals in the capacitive chip based on the example shown in FIG. 23.

FIG. 24 shows an example of unit allocation for the individual power supply terminals and ground terminals in the capacitive chip based on the example shown in FIG. 23. The capacitive chip 1104 shown in FIG. 24 has 36 capacitive device units 1116. As many capacitive device units 1116 as shown in FIG. 23 are allocated for pair numbers 1, 3, 4, 5, 6, and 7 of the power supply terminals and ground terminals of the first LSI chip 1030 according to the respective unit allocations 1118.

Figure 25:
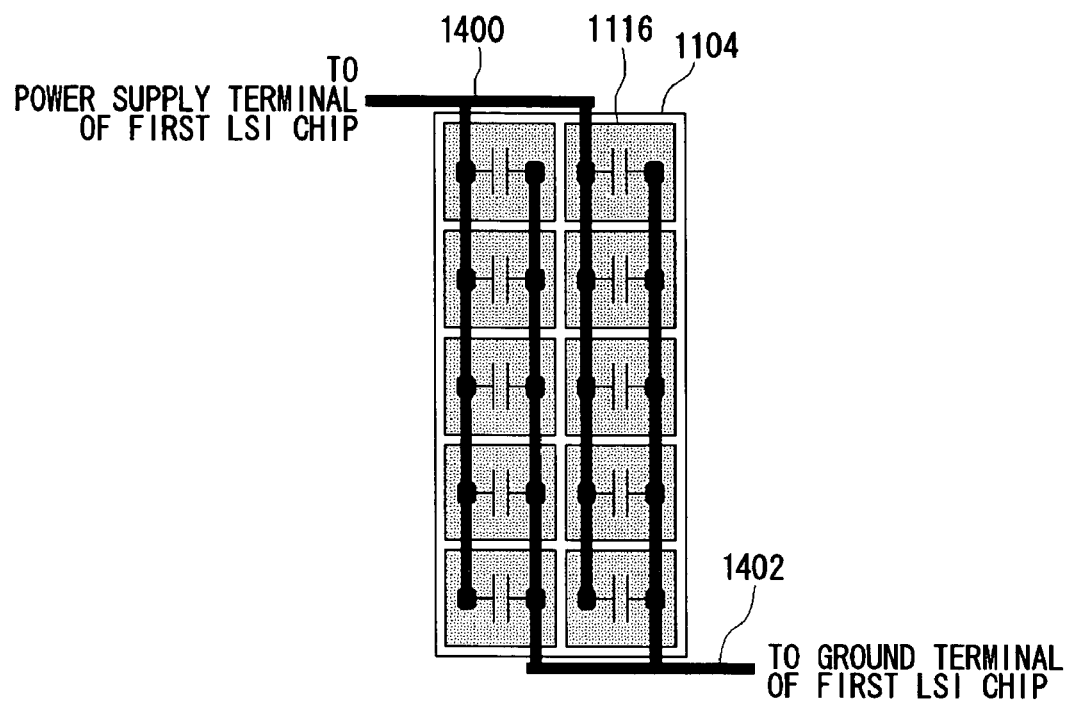
FIG. 25 is a diagram showing an example of wiring for connecting some of the capacitive device units on the capacitive chip.

FIG. 25 shows an example of wiring for connecting a plurality of the capacitive device units 1116 on the capacitive chip 1104. The example of FIG. 25 is for situations where ten capacitive device units 1116 corresponding to pair number 3 are connected in parallel. The power supply sides and the ground sides of the respective capacitive device units 1116 are short-circuited by power supply wiring 1400 and ground wiring 1402, respectively. The traces of the power supply wiring 1400 and those of the ground wiring 1402 are tied up and connected to the power supply and ground terminals of the first LSI chip 1030, respectively.

As above, the capacitive device units 1116 on the capacitive chip 1104 are allocated depending on the decoupling capacitances necessary for the respective supply-ground pairs. This allows more effective reduction of EMI. Since the capacitive device units 1116 can be used without waste, it is possible to miniaturize the capacitive chip 1104.

Incidentally, in this example, the numbers of capacitive device units 1116 to allocate are changed depending on the decoupling capacitances necessary for the respective supply-ground pairs. Instead, one capacitive device unit 1116 may be allocated for each individual supply-ground pair so that the capacitance of the capacitive device unit 1116 is determined depending on the decoupling capacitance required.

The present invention is not limited to the examples described above, and various types of modifications including design changes may be made thereto based on the knowledge of those who skilled in the art. All such modified examples are also intended to fall within the scope of the present embodiment.

Figure 26:
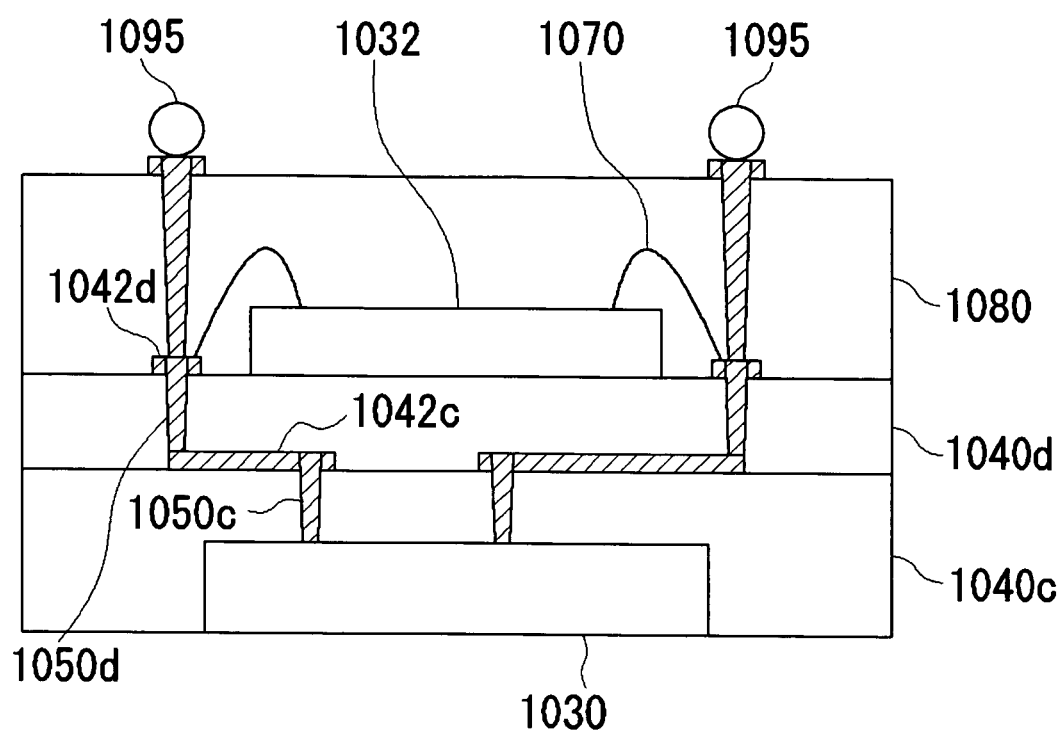
FIG. 26 is a diagram showing an example of wiring for connecting the first LSI chip and the second LSI chip.

For example, in the first to fourth examples described above, a single layer of wiring is formed by the vias 1050. Nevertheless, as shown in FIG. 26, the insulating resin film 1040 and the vias 1050 may have a double-layer structure. In this case, the vias 1050c formed in the first layer of insulating resin film 1040c establish connection between the first LSI chip 1030 and a conductive film 1042c which is formed on the insulating resin film 1040c. Then, the vias 1050d formed in the second layer of insulating resin film 1040d establish connection between the conductive film 1042c and a conductive film 1042d which is formed on the insulating resin film 1040d. Wires 1070 electrically connect the conductive film 1042d and the second LSI chip 1032.

When the insulating resin film 1040 and the vias 1050 have the double-layer structure for extended wiring, electric connection between the first LSI chip 1030 and the second LSI chip 1032 can be established easily irrespective of the positions of the ground terminals on the first LSI chip 1030. This improves the degree of flexibility in wiring.

The means for connecting the second LSI chip 1032 electrically is not limited to the wire-bonding connection using the wires 1070 as described above. For example, flip-chip connection may be applied, in which case hemispherical bumps are formed on the electrodes of the second LSI chip 1032 so that the second LSI chip 1032 and the conducive film 1042 are electrically connected via the bumps.

What is claimed is:

1. A semiconductor integrated circuit apparatus comprising:
   an insulating resin film;
   a first circuit device embedded in the insulating resin film;
   a flat-shaped wiring layer of fixed potential, being formed on the insulating resin film above the first circuit device; and
   a second circuit device formed on the wiring layer, wherein
   the first circuit device or the second circuit device is a capacitive chip including a plurality of capacitive device units,
   at least one of the capacitive device units has a low-capacity capacitor and a high-capacity capacitor, and
   the low-capacity capacitor and the high-capacity capacitor are connected in parallel.

2. A semiconductor integrated circuit apparatus comprising:
   an insulating resin film;
   a first circuit device embedded in the insulating resin film;
   a first wiring layer having one end connected to the first circuit device and the other end extended to reach a top of the insulating resin film;
   a second circuit device formed on the insulating resin film above the first circuit device; and
   a second wiring layer of fixed potential, being formed around the second circuit device, wherein
   the first circuit device or the second circuit device is a capacitive chip including a plurality of capacitive device units,
   at least one of the capacitive device units has a low-capacity capacitor and a high-capacity capacitor, and
   the low-capacity capacitor and the high-capacity capacitor are connected in parallel.

3. The semiconductor integrated circuit apparatus according to claim 2, further comprising
   a third wiring layer of variable potential, being formed on the insulating resin film above the first circuit device so as to lie between the second circuit device and the second wiring layer.

4. The semiconductor integrated circuit apparatus according to claim 3, wherein
   the second wiring layer has a wiring height greater than that of the third wiring layer.

5. A semiconductor integrated circuit apparatus comprising:
   an insulating resin film;
   a first circuit device embedded in the insulating resin film;
   a flat-shaped wiring layer of fixed potential, being formed on the insulating resin film above the first circuit device; and
   a second circuit device formed on the wiring layer,
   wherein the wiring layer is larger than the second circuit device,
   the first circuit device or the second circuit device is a capacitive chip including a plurality of capacitive device units,
   at least one of the capacitive device units has a low-capacity capacitor and a high-capacity capacitor, and
   the low-capacity capacitor and the high-capacity capacitor are connected in parallel.

6. A semiconductor integrated circuit apparatus comprising:
   an insulating resin film;
   a first circuit device embedded in the insulating resin film;
   a first wiring layer having one end connected to the first circuit device and the other end extended to reach a top of the insulating resin film;
   a second circuit device formed on the insulating resin film above the first circuit device; and
   a second wiring layer of fixed potential, being formed around the second circuit device in a continuous manner, wherein:
   the first circuit device or the second circuit device is a capacitive chip including a plurality of capacitive device units;
   at least one of the capacitive device units has a low-capacity capacitor and a high-capacity capacitor; and
   the low-capacity capacitor and the high-capacity capacitor are connected in parallel.

* * * * *